US009344101B2

United States Patent
Ueki

(10) Patent No.: US 9,344,101 B2
(45) Date of Patent: May 17, 2016

(54) SEMICONDUCTOR DEVICE, ELECTRONIC DEVICE AND SENSING METHOD

(71) Applicant: RENESAS ELECTRONICS CORPORATION, Tokyo (JP)

(72) Inventor: Hiroshi Ueki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/830,623

(22) Filed: Aug. 19, 2015

(65) Prior Publication Data

US 2016/0056828 A1 Feb. 25, 2016

(30) Foreign Application Priority Data

Aug. 22, 2014 (JP) ................................. 2014-169032

(51) Int. Cl.
*H03M 1/12* (2006.01)
*H03M 1/00* (2006.01)

(52) U.S. Cl.
CPC ................ *H03M 1/002* (2013.01); *H03M 1/12* (2013.01)

(58) Field of Classification Search
CPC ............................. H03M 1/002; H03M 1/12
USPC .......................................... 341/118, 155, 158
See application file for complete search history.

(56) References Cited

U.S. PATENT DOCUMENTS

| 6,480,127 B1 * | 11/2002 | Aslan ...................... G01K 7/01 |
| | | 257/467 |
| 7,009,546 B2 * | 3/2006 | Mayer ..................... H03M 3/32 |
| | | 341/155 |
| 7,259,707 B2 * | 8/2007 | Kobayashi .............. G01L 9/065 |
| | | 341/119 |
| 7,304,857 B2 | 12/2007 | Yamashita |
| 8,736,468 B2 * | 5/2014 | Fabregas ................. H03M 1/12 |
| | | 341/118 |

FOREIGN PATENT DOCUMENTS

JP 2005-260291 A 9/2005

* cited by examiner

*Primary Examiner* — Khai M Nguyen
(74) *Attorney, Agent, or Firm* — McGinn IP Law Group, PLLC

(57) ABSTRACT

In order to reduce power consumption, a semiconductor device includes an RTC for generating a piece of time information and a first activation signal SW3, a comparator for determining whether the value of an analog input signal exists within a predetermined range, an AD conversion circuit for converting the analog input signal to a digital signal in response to a common activation signal, and a CPU for processing the digital signal in response to the common activation signal. When the analog input signal does not exist within the predetermined rang, the comparator generates the common activation signal. Then, the CPU stores the piece of digital information corresponding to the digital signal as well as the piece of time information from the RTC into a storage circuit.

12 Claims, 21 Drawing Sheets

SEMICONDUCTOR DEVICE, ELECTRONIC DEVICE AND SENSING METHOD

CROSS-REFERENCE TO RELATED APPLICATIONS

The disclosure of Japanese Patent Application No. 2014-169032 filed on Aug. 22, 2014 including the specification, drawings and abstract is incorporated herein by reference in its entirety.

BACKGROUND

The present invention relates to a semiconductor device. More particularly, the present invention relates to a semiconductor device used to sense an analog input signal from a sensor, an electronic device including the semiconductor device and the sensor, and a sensing method for sensing the analog input signal.

Sensing of the environment is periodically performed using a sensor and a semiconductor device. For example, Patent Document 1 (Japanese Patent Application Laid-Open No. 2005-260291) describes an electronic circuit including a temperature sensor, an RF chip (semiconductor device), and a processor chip, in which a signal from the temperature sensor is transmitted as a radio signal.

SUMMARY

For example when considering the temperature of the surrounding environment as the target of sensing, the temperature changes as time passes. FIG. 19 is a view of the profile of temperature that changes according to the change in time (temperature profile). In this figure, the horizontal axis represents the time t and the vertical axis represents the temperature T.

The temperature profile of the surrounding environment shown in FIG. 19 may be obtained by measuring the temperature at a predetermined time interval using a temperature sensor as a sensor, and by accumulating the measurement times and measurement results to form a temperature profile. As for a semiconductor device used in conjunction with the temperature sensor in order to measure the temperature at a predetermined time interval and accumulate measurement values, it may be possible to use a semiconductor device including a timer circuit such as a real time clock (RTC), an analog/digital (hereinafter, referred to as AD) conversion circuit, a microprocessor (hereinafter, referred to as CPU), and a storage circuit such as a memory.

FIG. 21 is a block diagram showing the configuration of an electronic device that the present inventors have studied to obtain the temperature profile. In FIG. 21, reference numeral 2100 denotes a semiconductor device, reference numeral 2101 denotes a temperature sensor, and reference numeral 2108 denotes a power supply.

The semiconductor device 2100 includes a plurality of circuit blocks. However, the circuit blocks related to the temperature sensor 2101 are only shown in this figure. In other words, an AD conversion circuit 2103 to which data (sensor data) is supplied from the temperature sensor 2101, a CPU 2107, a storage circuit 2104, an RTC 2102, and a switch 2106 are shown as the circuit blocks included in the semiconductor device 2100. Further, in this figure, reference numeral 2105 denotes a switch. FIG. 20 shows the power consumption profile of the electronic device when the electronic device shown in FIG. 21 is operated. In FIG. 20, the horizontal axis represents the time t and the vertical axis represents the power consumption P of the electronic device.

The measurement of the temperature is performed as shown in FIG. 19 at each of the measurement times 1, 2, 3, and so on to the measurement time 8 along the course of time. The times between adjacent measurement times are set to substantially the same time. For example, the time between the measurement times 1 and 2 is set to be equal to the time between the measurement times 2 and 3 in order to perform the measurement at a predetermined time interval. The period when the measurement is performed is shown as period a in FIG. 20. Further, the period when the measurement is not performed is shown as period b in FIG. 20. This predetermined time interval is achieved in such a way that the temperature sensor 2101 and each of the circuit blocks within the semiconductor device 2100 are activated to operate at the predetermined time interval by the RTC 2102.

With this configuration, the temperature sensor 2101 and each of the circuit blocks within the semiconductor device 2100 operate in the period a, and as a result, the power consumption P of the electronic device increases. On the other hand, in the period b, the temperature sensor 2101 as well as each of the AD conversion circuit 2103, the CPU 2107, and the storage circuit 2104 in the semiconductor device 2100 are put into a low power consumption state. Thus, the power consumption P of the electronic device decreases. Note that the RTC 2102 is still in the operating state to measure the time also in the period b, which is, however, omitted in FIG. 20 because the power consumption of this operation is small. Here, the low power consumption state means, for example, that the AD conversion circuit 2103, the CPU 2107, and the storage circuit 2104 are moved to the lower power consumption mode, or that the supply of the power supply voltage is stopped.

Next, the outline of the operation of the electronic device shown in FIG. 21 will be described. First, the time is measured by the RTC 2102. When the time reaches a predetermined time, the operation of the period a is started. In the period a, the RTC 2102 turns each of the switches 2105 and 2106 to the ON state. When the switches 2105 and 2106 are turned to the ON state, the power supply voltage is supplied to the temperature sensor 2101, the AD conversion circuit 2103, the CPU 2107, and the storage circuit 2104 from the power supply 2108 through each of the switches 2105 and 2106. Then, the respective circuits are activated.

The temperature sensor 2101 supplies sensor data corresponding to the temperature at this time to the semiconductor device 2100. The sensor data is received by the AD conversion circuit 2103. Then, the sensor data, which is an analog signal, is converted to corresponding a piece of digital information by the AD conversion circuit 2103. The piece of digital information is stored in the storage circuit 2104 by the CPU 2107. At this time, the CPU 2107 reads the time (measurement time) when the piece of digital information is obtained, from the RTC 2102. Then, the CPU 2107 stores the measurement time in the storage circuit 2104 together with the piece of digital information as a set. When the series of processes is completed, the CPU 2107 supplies a completion signal to the RTC 2102.

When receiving the completion signal, the RTC 2102 turns each of the switches 2105 and 2106 to the OFF state. In this way, the supply of the power supply voltage to each of the temperature sensor 2101, the AD conversion circuit 2103, the CPU 2107, and the storage circuit 2104 is stopped. Then, the period moves from the period a to the period b. When a predetermined time has elapsed, the RTC 2102 changes the switches 2105 and 2106 from the OFF state to the ON state again to move from the period b to the period a. After that, the period a and the period b are alternately repeated to measure the temperature at a predetermined time interval.

For example, when the room temperature is measured in order to obtain the temperature profile, the temperature sensor 2105, the AD conversion circuit 2103, the CPU 2107, and the storage circuit 2104 are put into an operating state at a predetermined time interval by the RTC 2102. In this case, the CPU 2107 stores the piece of digital information corresponding to the temperature at this time together with the piece of time information as a set, into the storage circuit 2104 at every time interval. Meanwhile, the room temperature is not likely to change much for a short time. In other words, it can be seen that there is little difference between the sensor data output from the temperature sensor 2101 at a certain measurement time, and the sensor data output from a temperature sensor 2102 at the next measurement time (adjacent measurement time). Even in such a case, in the electronic device shown in FIG. 21, each of the AD conversion circuit 2103, CPU 2107, and the storage circuit 2104 is put into the operating state at each of the measurement times that occur periodically (the measurement times 1 to 8 in FIG. 19). For this reason, even when there is no difference between sensor data, the electronic device including the semiconductor device 2100 consumes power, thereby resulting in an increase in the power consumption.

Patent Document 1 is not aware of reduction in the power consumption taking into account the difference between sensor data that occur periodically.

An object of the present invention is to provide a semiconductor device capable of reducing the power consumption.

These and other objects and advantages will become apparent from the following description of the present specification and the accompanying drawings.

A typical one of the aspects of the invention disclosed in this application will be briefly described below.

The present inventors have studied the screening test used in the medical field, which is a different field, as the knowledge to apply the concept of the screening test in order to reduce the cost. At that time, the present inventors conceived the idea of reducing the power consumption (cost) by considering the cost as power consumption which is energy. The screening test roughly selects suspicious objects and closely examines the selected objects. Thus, the present inventors conceived the idea of roughly selecting the sensor data periodically supplied from the sensor to measure the selected sensor data, instead of measuring all the sensor data.

A semiconductor device based on this concept includes: a timer circuit for generating a piece of time information corresponding to a measurement time, as well as a first activation signal; a determination circuit for determining whether the value of an analog input signal exists within a predetermined range in response to the first activation signal; a first conversion circuit for converting the analog input signal to a digital signal in response to a second activation signal; and a processing circuit for processing the digital signal in response to a third activation signal. Here, when the analog input signal does not exist within the predetermined range, the determination circuit generates the second and third activation signals. Then, the processing circuit stores the piece of digital information corresponding to the digital signal, as well as the piece of time information from the timer circuit into a storage circuit.

When the analog input signal does not exist within the predetermined range, the first conversion circuit, the processing circuit, and the storage circuit will operate and thus the frequency of operation can be reduced. As a result, it is possible to reduce the power consumption.

Further, in an embodiment, a sensing method is provided. In other words, a sensing method is provided that has a processing circuit and a timer circuit to sense an analog input signal at a predetermined time interval by the timer circuit. Here, the predetermined time interval has the following periods: a first period for determining whether the value of the analog input signal exists within the predetermined range, and a second period when the processing circuit is turned to the non-operating state. In the first period, when it is determined that the value of the analog input signal does not exist within the predetermined range, a third period is inserted into the above period with the second period being shortened, in order that the processing circuit operates to store the piece of digital information corresponding to the analog input signal into the storage circuit.

When the analog input signal exists within the predetermined range, the second period when the processing circuit is turned to the non-operating state increases as compared to the case in which the analog input signal does not exist within the predetermined range. In this way, it is possible to reduce the power consumption.

The effect obtained by the representative one of the inventions disclosed in this application will be briefly described as follows.

It is possible to provide a semiconductor device capable of reducing the power consumption.

DETAILED DESCRIPTION

Figure 1:
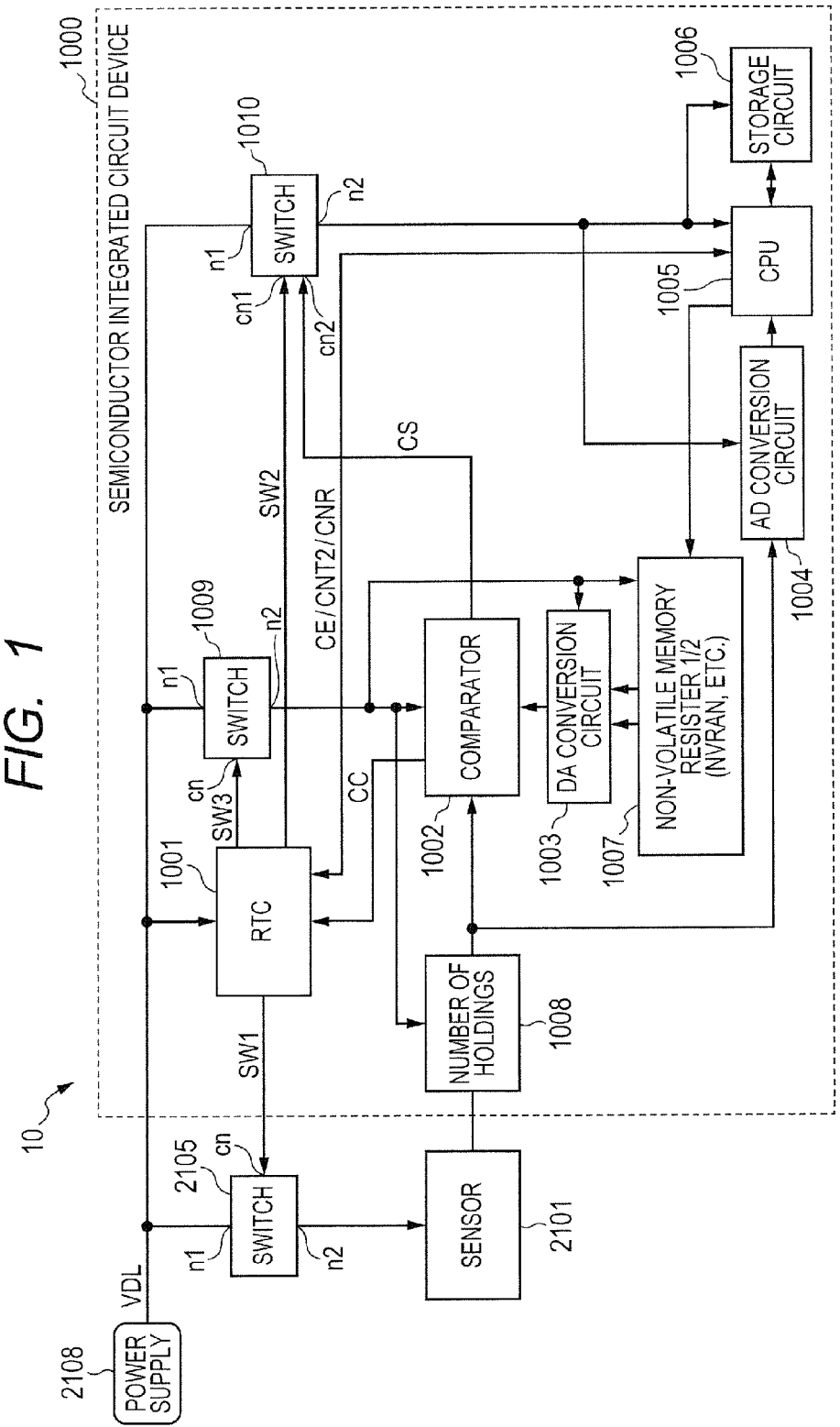
FIG. 1 is a block diagram showing the configuration of an electronic device according to a first embodiment.

Hereinafter, embodiments of the present invention will be described in detail with reference to the accompanying drawings. Note that in all the drawings for explaining the embodiments, the same reference numerals are given in principle to the same parts, and the repetitive description thereof in principle will be omitted.

Further, in a plurality of embodiments described below, the temperature is cited as a target of sensing. In other words, a description will be given to an example of measuring the temperature of the surrounding environment. However, the present invention is not limited to the measurement of the temperature.

First Embodiment

<General Configuration of Electronic Device and Semiconductor Device>

FIG. 1 is a block diagram showing the configuration of an electronic device according to a first embodiment. An electronic device 10 includes a power supply device (which is marked as power supply in the figure, and hereinafter also referred to as power supply) 2108, a temperature sensor (which is marked as sensor in the figure, and hereafter also referred to as sensor) 2101, a switch 2105, and a semiconductor device 1000. Although not particularly limited, the semiconductor device 1000 is configured in such a way that a plurality of circuit blocks, described below, are formed in one semiconductor substrate by the semiconductor production technology to form one semiconductor device. Further, the semiconductor device 1000 includes a CPU, a storage circuit, and the like, and can be regarded as a so-called microcontroller (MCU).

The semiconductor device 1000 includes a plurality of circuit blocks. Some of the circuit blocks are shown in FIG. 1. In FIG. 1, reference numeral 1001 denotes an RTC and reference numeral 1002 denotes a comparator. The RTC 1001 functions as a timer circuit and the comparator 1002 functions as a determination circuit. Reference numeral 1003 denotes a digital/analog (hereinafter referred to as DA) conversion circuit for converting a digital signal to an analog signal, and reference numeral 1004 denotes an AD conversion circuit. Reference numeral 1005 denotes a CPU that operates according to a program stored in a memory not shown. Reference numeral 1006 denotes a storage circuit, which is configured, for example, by a rewritable volatile memory (for example, a so-called static type memory). Reference numeral 1007 denotes an electrically rewritable non-volatile memory (non-volatile memory), which is configured, for example, by NVRAM, flash memory, and the like. Reference numerals 1009 and 1010 respectively denote switches. Further, reference numeral 1008 denotes a holding circuit for holding an analog signal, which is configured, for example, by a circuit including a capacitance.

Each of the switches 1009 and 2105 has a pair of nodes n1, n2 and a control node cn, and makes between the pair of nodes n1 and n2 being electrically conductive (ON state) or not conductive (OFF state), according to the voltage of a control signal supplied to the control node cn.

Further, the switch 1010 has a pair of nodes n1, n2 and two control nodes cn1, cn2. The switch 1010 makes between the nodes n1 and n2 being electrically conductive (ON state) when a control signal (common activation signal CS) is supplied from the comparator. Further, the switch 1010 makes between the nodes n1 and n2 being electrically not conductive when a control signal (end signal SW2) is supplied from the RTC 1001. For example, if the high level of the control signal shows that the particular control signal is valid, the nodes n1 and n2 are conductive when the common activation signal CS supplied to the control node n2 changes to the high level. Then, the nodes n1 and n2 are not conductive when the end signal SW2 supplied to the control node n1 changes to the high level. Similarly, also in each of the switches 1009 and 2105, a pair of nodes n1 and n2 is conductive when the control signal supplied to the control node cn changes to the high level. On the other hand, the pair of nodes n1 and n2 is not conductive when the control signal supplied to the control node cn changes to the low level.

Although not particularly limited, in the power supply device 2108, a power supply line for supplying the power supply voltage Vd is coupled to a ground line for supplying the ground voltage Vs. Of these lines, only the power supply line VDL for supplying the power supply voltage Vd is shown in FIG. 1, in which the ground line is omitted. The omitted ground line is coupled to the sensor 2101 and the semiconductor device 1000, and is coupled to each of the circuit blocks included in the semiconductor device 1000. In this way, the ground voltage Vs is supplied from the power supply device 2108 to the sensor 2101 and to each of the circuit blocks within the semiconductor device 1000.

Meanwhile, the power supply line VDL is coupled to the node n1 of the switch 2105 and to the semiconductor device 1000. The power supply line VDL coupled to the semiconductor device 1000 is coupled to the RTC 1001 as well as the node n1 of each of the switches 1009 and 1010 within the semiconductor device 1000.

The node n2 of the switch 2105 is coupled to the sensor 2101. Then, a control signal (activation signal SW1) is supplied to the control node cn of the switch 2105 from the RTC 1001. Thus, the switch 2105 is turned to the ON state or the OFF state according to the activation signal SW1 from the RTC 1001. For example, when the activation signal SW1 from the RTC 1001 is high level, the switch 2105 is turned to the ON state, and is turned to the OFF state when the activation signal SW1 is low level. When the switch 2105 is turned to the ON state, the power supply voltage Vd is supplied to the sensor 2101 through the switch 2105. The sensor 2101 is operable with the power supply voltage Vd and the ground voltage VS as the operation voltage. Thus, when the power supply voltage Vd is supplied to the sensor 2101 through the switch 2105, the sensor 2101 operates to generate an analog input signal (sensor data) that shows the temperature at this time. Then, the sensor 2101 supplies the analog input signal to the semiconductor device 1000.

The RTC 1001 is operable with the power supply voltage Vd and the ground voltage Vs as the operation voltage. Thus, the RTC 1001 operates when the power supply voltage Vd is supplied through the power supply line VDL.

The node n2 of the switch 1009 is coupled to the comparator 1002, the DA conversion circuit 1003, the non-volatile memory 1007, and the holding circuit 1008. Then, the control node cn of the switch 1009 is supplied with a control signal (first activation signal) SW3 from the RTC 1001. Each of the comparator 1002, the DA conversion circuit 1003, the non-volatile memory 1007, and the holding circuit 1008 is operable with the power voltage Vd and the ground voltage Vs as the operation voltage. In other words, these circuits are operable when the power supply voltage Vd and the ground voltage Vs are supplied. Each of the comparator 1002, the DA conversion circuit 1003, the non-volatile memory 1007, and the holding circuit 1008 is supplied with the ground voltage Vs through the ground line not shown, as well as the power supply voltage Vd through the switch 1009.

Thus, when the switch 1009 is made conductive by the first activation signal SW3 from the RTC 1001, the power supply voltage Vd is supplied to each of the comparator 1002, the DA conversion circuit 1003, the non-volatile memory 1007, and the holding circuit 1008 through the switch 1009. In other words, each of the comparator 100, the DA conversion circuit 1003, the non-volatile memory 1007, and the holding circuit 1008 is operable in response to the first activation signal SW3 from the RTC 1001.

In the present embodiment, the switches 2105 and 1009 can be synchronously turned to the ON/OFF state so that the sensor data from the sensor 2101 can be held by the holing circuit 1008 and compared by the comparator 1002. In other words, the first activation signal SW3 and the activation signal SW1 are synchronous with each other, and when the sensor 2101 is put into an operating state, the holding circuit 1008 and the comparator 1002 are also put into the operating state.

The node n2 of the switch 1010 is coupled to the AD conversion circuit 1004, the CPU 1005, and the storage circuit 1006. Also, each of the AD conversion circuit 1004, the CPU 1005, and the storage circuit 1006 is operable with the power supply voltage Vd and the ground voltage Vs as the operation voltage. The ground voltage Vs is supplied to each of the AD conversion circuit 1004, the CPU 1005, and the storage circuit 1006 through the ground line not shown. On the other hand, the power supply voltage Vd is supplied from the power supply line VDL through the switch 1010. In this way, when the switch 1010 is put into the ON state by the common activation signal CS from the comparator 1002, the power supply voltage Vd is supplied to the AD conversion circuit 1004, the CPU 1005, and the storage circuit 1006 through the switch 1010. In other words, each of the AD conversion circuit 1004, the CPU 1005, and the storage circuit 1006 is operable in response to the common activation signal CS.

In the present embodiment, each of the AD conversion circuit 1004, the CPU 1005, and the storage circuit 1006 is operable in response to the common activation signal CS. However, a different switch may be provided to each of the AD conversion circuit 1004, the CPU 1005, and the storage circuit 1006. In other words, it is also possible that, for example, the switch 1010 is configured with three switches 1010-1 to 1010-3 (not shown) in such a way that the switch 1010-1 is provided between the power supply line VDL and the AD conversion circuit 1004, the switch 1010-2 is provided between the power supply line VDL and the CPU 1005, and the switch 1010-3 is provided between the power supply line VDL and the storage circuit 1006. In this case, the switch 1010-1 is controlled to be turned ON/OFF by the second activation signal from the comparator 1002, and the switches 1010-2 and 1010-3 are controlled to be turned ON/OFF by the third activation signal from the comparator 1002. In this case, each of the second and third activation signals is the same control signal as the common activation signal CS.

In terms of the reduction in the number of signal lines for transmitting each of the second and third activation signals or other aspects, it is desirable to use the common activation signal CS that is common to the second and third activation signals. Of course it may also be possible to provide a fourth activation signal for the switch 1010-3, in addition to the second and third activation signals.

The holding circuit 1008 operates in response to the first activation signal to hold the sensor data (analog signal) at this time. The held sensor data is supplied to the comparator 1002 and the AD conversion circuit 1004. The comparator 1002 compares the value of the sensor data that is supplied from the holding circuit 1008 with the voltage value from the DA conversion circuit 1003. The configuration of the comparator 1002 will be described below with reference to FIG. 17. In this case, the DA conversion circuit 1003 supplies voltage values to identify the voltage range. In other words, the DA conversion circuit 1003 supplies the upper limit voltage value that specifies the upper limit of a predetermined voltage range, and the lower limit voltage value that specifies the lower limit of the predetermined voltage range to the comparator 1002.

The electrically rewritable non-volatile memory 1007 operates to supply piece of digital information corresponding to each of the upper and lower limits of the predetermined voltage range, to the DA conversion circuit 1003. The DA conversion circuit 1003 sequentially converts the piece of digital information corresponding to each of the upper and lower limits into an analog signal. The comparator 1002 determines whether the value of the sensor data exists within the predetermined voltage range based on the voltage of the converted analog signal as the reference voltage. Then, the comparator 1002 supplies the determination result, as the common activation signal CS and detection signal CC, to the control node cn2 of the switch 1010 and to the RTC 1001. In the present embodiment, the non-volatile memory 1007 functions as resisters 1 and 2. However, the present invention is not particularly limited to this example. Here, the register 1 of the two registers stores the piece of digital information corresponding to the lower limit of the predetermined voltage range. Further, the register 2 stores the piece of digital information corresponding to the upper limit.

In the present embodiment, when the value of the sensor data does not exists within the predetermined voltage range, namely, when the value of the sensor data is above or below the predetermined voltage range, the comparator 1002 generates the common activation signal CS of high level and supplies to the control node cn2 of the switch 1010. In response to the high level common activation signal CS, the switch 1010 is turned ON. Thus, the power supply voltage Vd is supplied to the AD conversion circuit 1004, the CPU 1005, and the storage circuit 1006 from the voltage line VDL through the switch 1010. In other words, each of the AD conversion circuit 1004, the CPU 1005, and the storage circuit 1006 is put into the operating state in response to the common activation signal CS.

The AD conversion circuit 1004 is turned to the operating state and thus converts the value of the sensor data held by the holding circuit 1008 into a digital signal. The converted digital signal is supplied to the CPU 1005. The CPU 1005 writes the piece of digital information corresponding to the supplied digital signal, together with the piece of time information CNT2 from the RTC 1001, into the storage circuit 1006 (so that the storage circuit 1006 holds them). In this way, when the value of the sensor data output from the sensor 2101 does not exist within the predetermined voltage range, the sensor data (analog signal) at this time is converted to a digital signal by the AD conversion circuit 1004. Then, both the piece of digital information corresponding to the digital signal and the piece of time information CNT2 at this time are held in the storage circuit 1006. After the completion of writing the piece of digital information and the piece of time information CNT2 at this time into the storage circuit 1006, the CPU 1005 supplies a control signal (completion signal) CE to the RTC 1001.

The RTC 1001 receives the completion signal CE and supplies the end signal SW2 of high level to the control node cn1 of the switch 1010. In this way, the state of the switch 1010 changes from the ON state to the OFF state. When the switch 1010 changes to the OFF state, the power supply to the AD conversion circuit 1004, the CPU 1005, and the storage circuit 1006 is stopped. In this way, after the piece of digital information corresponding to the sensor data at this time and the piece of time information CNT2 at this time are stored in the storage circuit 1006, each of the AD conversion circuit 1004, the CPU 1005, and the storage circuit 1006 is put into the non-operating state to suppress an increase in the power consumption. Further, when receiving the completion signal CE, the RTC 1001 changes the activation signal SW1 and the first activation signal SW3 to a low level. In this way, the switches 2105 and 1009 change to the OFF state, and as a result, the power supply to the sensor 2101, the comparator 1002, the DA conversion circuit 1003, and the non-volatile memory 1007 is stopped.

On the other hand, when the value of the sensor data exists within the predetermined voltage range, the comparator 1002 generates the detection signal CC instead of generating the common activation signal CS. Because the common activation signal CS is not generated, the low level is supplied to the control node n2 of the switch 1010. The switch 1010 is turned to the OFF state, so that the power supply voltage Vd is not supplied to the AD conversion circuit 1004, the CPU 1005, and the storage circuit 1006. Thus, the AD conversion circuit 1004, the CPU 1005, and the storage circuit 1006 continue the non-operating state and it is possible to suppress an increase in the power consumption. Further, in response to the formation (high level) of the detection signal CC, the RTC 1001 changes each of the activation signal SW1 and the first activation signal SW2 to a low level. In this way, each of the switches 1009 and 2105 is turned to the OFF state. Thus, the power supply of the power supply voltage Vd to the comparator 1002, the DA conversion circuit 1003, the non-volatile memory 1007, and the sensor 2101 is stopped in order to reduce the power consumption.

Although not particularly limited, in the present embodiment, the CPU 1005 changes or updates the piece of digital information stored in the non-volatile memory 1007. For example, the CPU 1005 writes the piece of digital information corresponding to the digital signal from the AD conversion circuit 1004, as well as the piece of time information CNT2 at this time into the storage circuit 1006. In this case, the CPU 1005 generates the piece of digital information obtained by performing an arithmetic operation on the piece of digital information written in the storage circuit 1006, and supplies the piece of digital information to the non-volatile memory 1007, in order to change or update the value of the register 1 and/or the register 2 in the non-volatile memory 1007. In this way, it is possible to set a new voltage range to the non-volatile memory 1007.

For example, the CPU 1005 generates the piece of digital information by adding (subtracting) a value (predetermined threshold) with the measurement tolerance taken into account, to (from) the piece of digital information corresponding to the sensor data. Then, the CPU 1005 writes the generated piece of digital information in the registers 1 and 2 of the non-volatile memory 1007. In other words, the CPU 1005 generates the piece of digital information corresponding to the value lower by the amount of the measurement tolerance, as well as the piece of digital information corresponding to the value higher by the amount of the measurement tolerance, with respect to the value of the measured piece of digital information. Then, the CPU 1005 writes the generated piece of digital information in the registers 1 and 2 to set a predetermined voltage range for the next measurement. To cite an example, if the measured piece of digital information is the value corresponding to 25 degrees C. and the measurement tolerance is plus/minus 0.2 degrees C., the piece of digital information corresponding to 24.8 degrees C. (=25 degrees C.−0.2 degrees C.) is written in the register 1, and the piece of digital information corresponding to 25.2 degrees C. (=25 degrees C.+0.2 degrees C.) is written in the register 2. In this way, in the next measurement, or when the value of the sensor data from the sensor 2101 is determined, the voltage range having the lower limit voltage corresponding to 24.8 degrees C. and the upper limit voltage corresponding to 25.2 degrees C., is used as the predetermined voltage range to be compared with the value of the sensor data.

Figure 2:
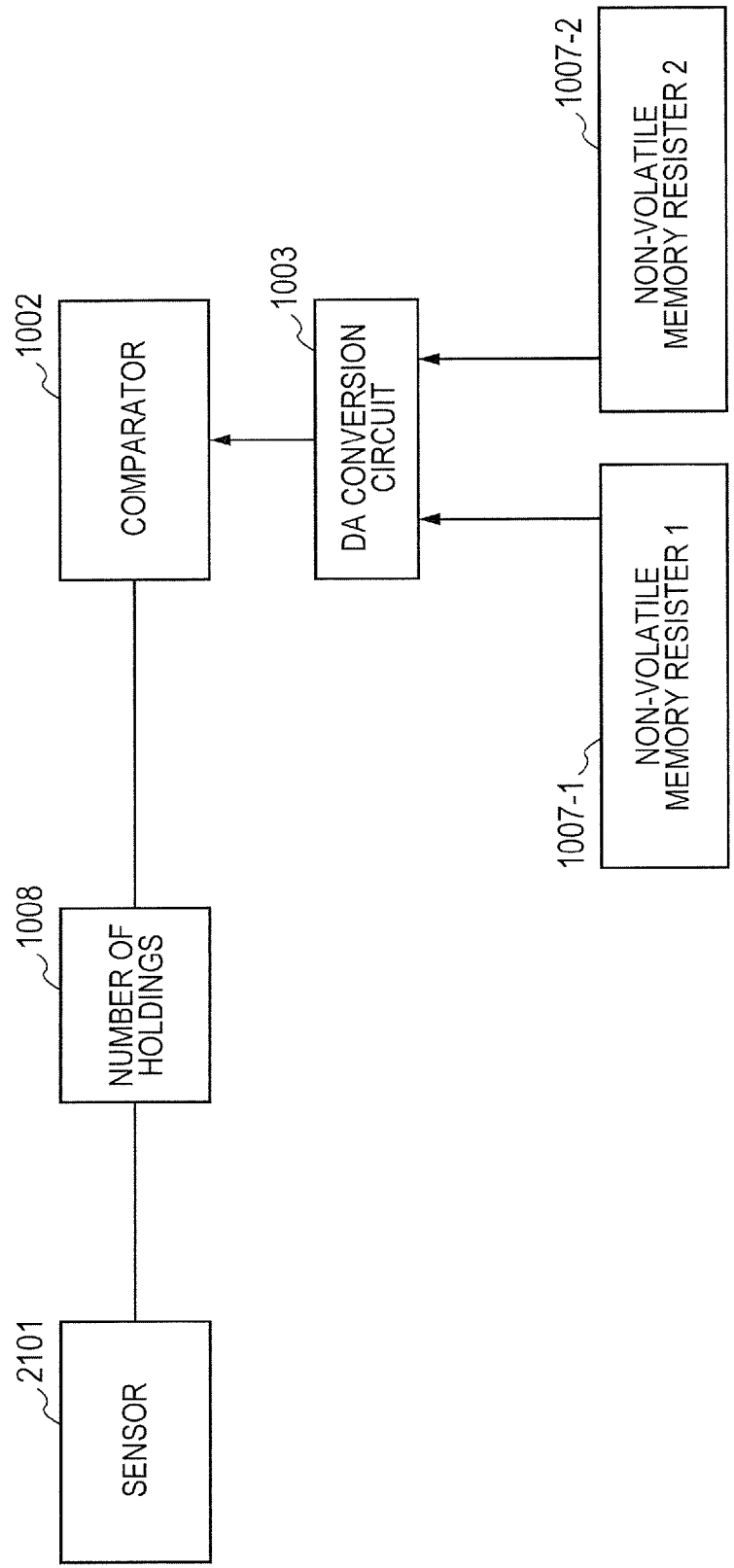
FIG. 2 is a schematic view of the configuration of a part of a semiconductor device according to the first embodiment.

Of the circuit blocks shown in FIG. 1, FIG. 2 is a schematic view focusing on the comparator 1002, the holding circuit 1008, the DA conversion circuit 1003, the non-volatile memory 1007, and the sensor 2101, which shows the coupling relationship of the respective circuit blocks. In FIG. 2, the register 1 in the non-volatile memory 1007 is represented by 1007-1, and the register 2 is represented by 1007-2. Although not particularly limited, the DA conversion circuit 1003 converts the piece of digital information written in the register 1007-1 into analog information, and supplies to the comparator 1002. The comparator 1002 compares the value of the sensor data from the holding circuit 1008 with the analog information from the DA conversion circuit 1003. Then, the comparator determines whether the value of the sensor data is lower than the lower limit of the predetermined range. In the next timing, the DA conversion circuit 1003 converts the piece of digital information written in the register 1007-2 into analog information, and supplies to the comparator 1002. In this way, the comparator 1002 determines whether the value of the sensor data exceeds the upper limit of the predetermined range.

When it is determined that the value of the sensor data exceeds the upper limit or below the lower limit, the comparator 1002 generates the common activation signal CS (FIG. 1) as described above. On the other hand, when the value of the sensor data exists between the upper and lower limits, the comparator 1002 generates the detection signal CC (FIG. 1) instead of generating the common activation signal CS, and supplies the detection signal CC to the RTC 1001.

Figure 16:
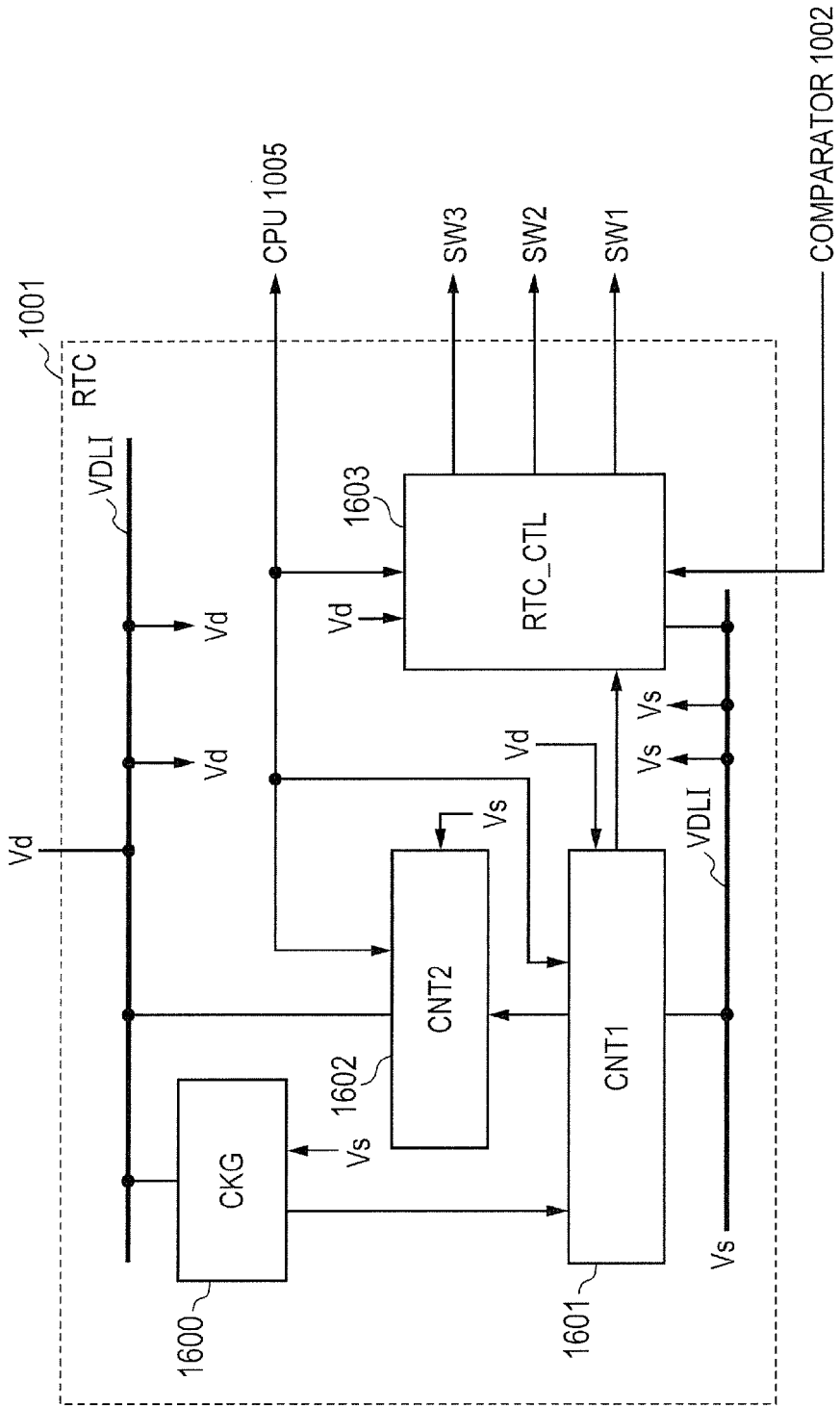
FIG. 16 is a block diagram showing the confirmation of an RTC provided in the semiconductor device according to the first embodiment.

Although a configuration example of the RTC 1001 is described below with reference to FIG. 16, the RTC 1001 includes a clock generation circuit for generating a clock signal at a predetermined time interval. Based on the clock signal, the activation signal SW1 and the first activation signal SW3 are generated. For this reason, also the activation signal SW1 and the first activation signal SW3 periodically change to the high level. Then, each of the switches 1009 and 2105 is periodically put into the operating state. Further, when receiving the detection signal CC, the RTC 1001 changes each of the activation signal SW1 and the first activation signal SW3 to the low level, and puts the switches 1009 and 2105 into the OFF state. Further, when the switch 1010 is turned to the ON state after the formation of the first activation signal SW3, the RTC 1001 generates the end signal SW2 in response to the completion signal CE from the CPU 1005. In this way, the end signal SW2 of high level is supplied to the control node n1 of the switch 1010. Then, the switch 1010 is turned to the OFF state. In other words, when the sensor data is out of the predetermined range and when the switch 1010 is turned to the ON state by the common activation signal CS from the comparator 1002, the piece of digital information corresponding to the sensor data as well as the piece of time information CNT2 are written in the storage circuit 1006 by the CPU 1005, and then the end signal SW2 changes to the high level. In this way, the state of the switch 1010 changes from the ON state to the OFF state after the piece of digital information and the piece of time information CNT2 are written in the storage circuit 1006.

Note that not only the completion signal CE and the piece of time information CNT2, but also various signals and data are transmitted and received between the CPU 1005 and the RTC 1001. An example of the signals and data to be transmitted and received is described with reference to FIGS. 16 and 17. In FIG. 1, the signals and data are represented by CNR.

<General Operation of Electronic Device and Semiconductor Device>

Figure 4:
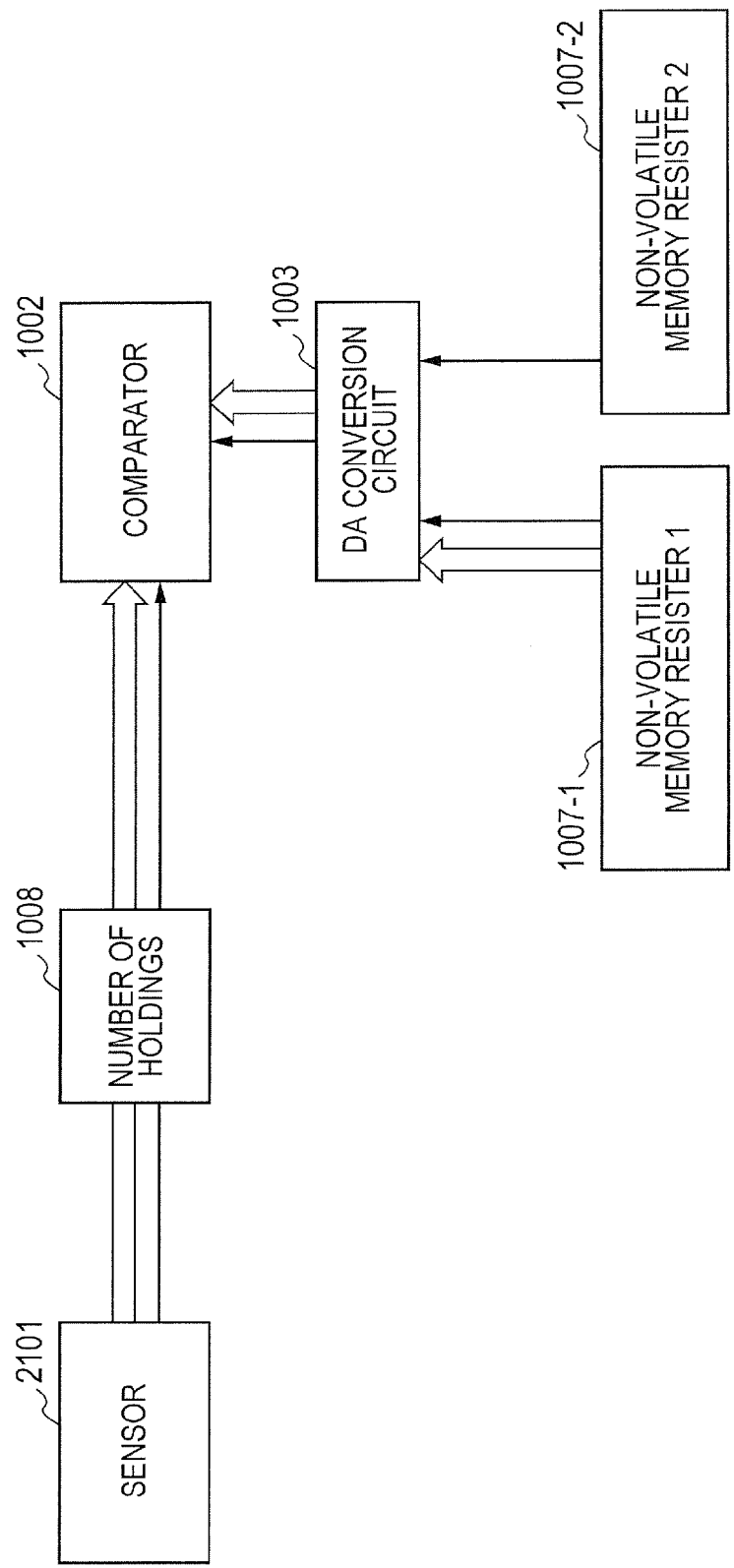
FIG. 4 is a schematic view of the operation of the semiconductor device according to the first embodiment.
Figure 5:
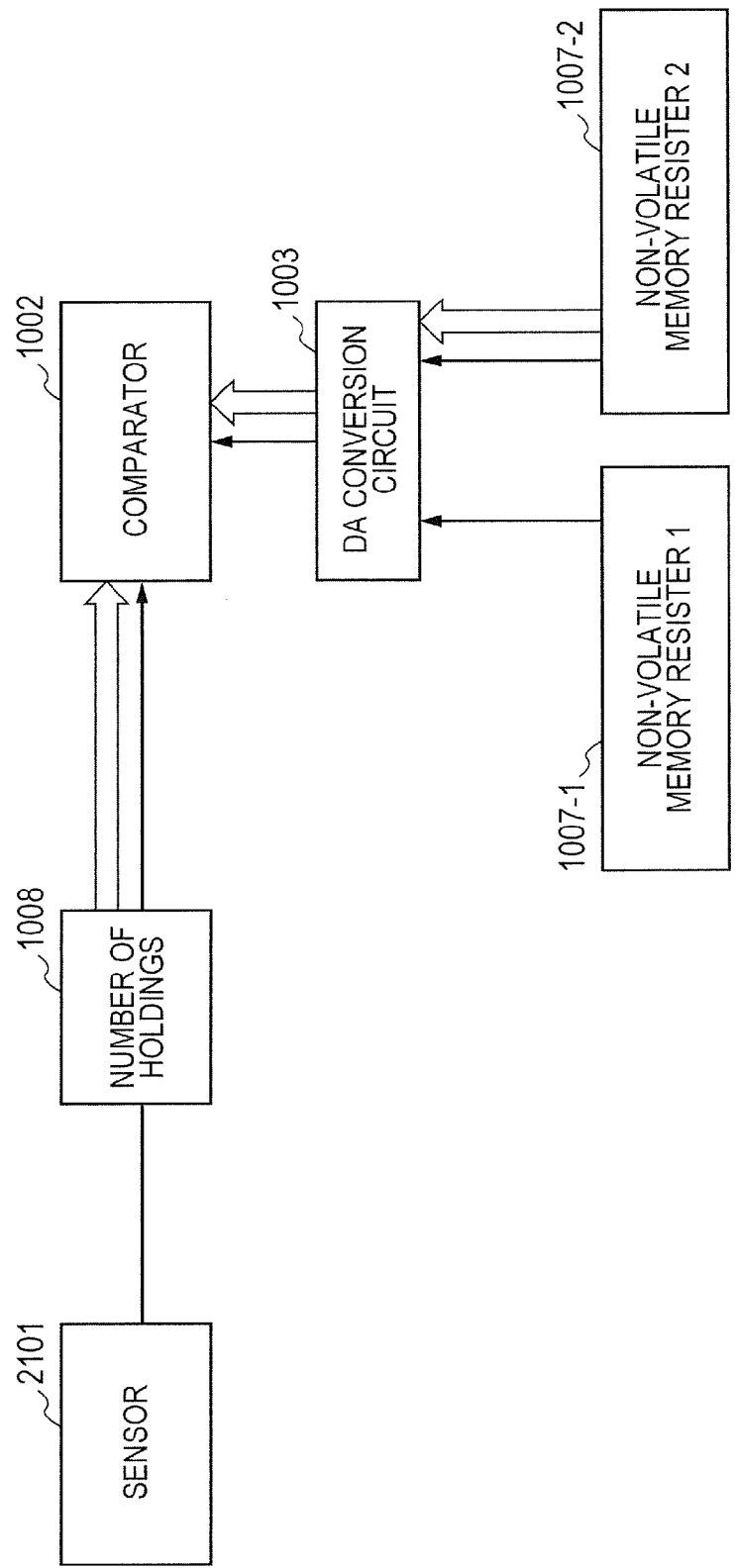
FIG. 5 is a schematic view of the operation of the semiconductor device according to the first embodiment.

Next, the operation of the electronic device 10 shown in FIG. 1 will be described in detail with reference to FIGS. 3 to 13. Here, each of FIG. 3 and FIGS. 6 to 13 shows the same configuration as the configuration shown in FIG. 1. Further, each of FIGS. 4 and 5 shows the same configuration as the configuration shown in FIG. 2. The same components as in FIGS. 1 and 2 are designated by the same reference numerals throughout the figures. However, a thick (white) line with an arrow is added to the part related to operations in order to show the operations in FIGS. 3 to 13. FIGS. 3 to 13 will be described mainly using the added thick lines with arrows.

First, the operation of the semiconductor device 1000 to periodically measure the sensor data will be described with reference to FIGS. 3 to 7.

Figure 3:
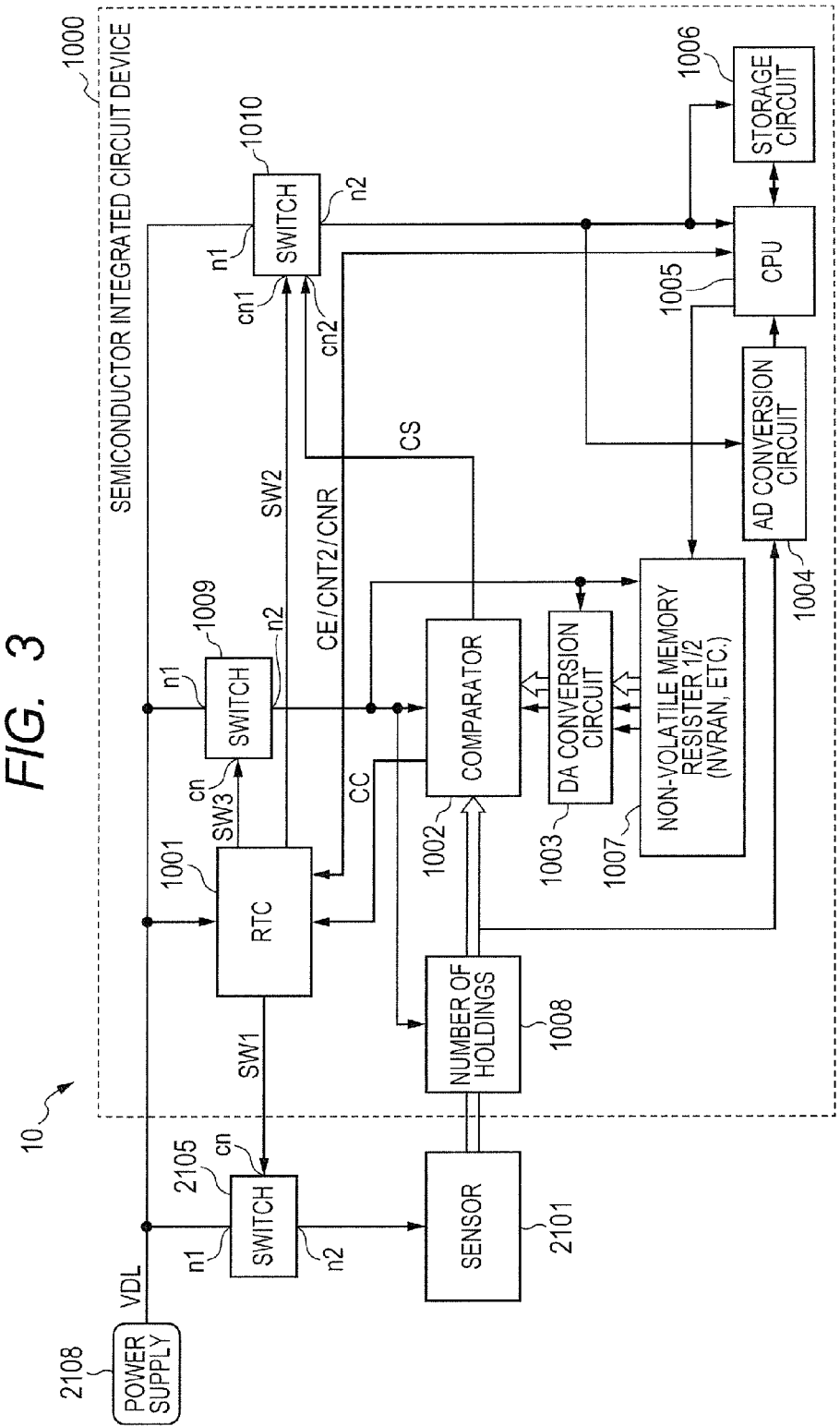
FIG. 3 is a block diagram of the operation of the electronic device according to the first embodiment.

In FIG. 3, the activation signal SW1 and the first activation signal SW3 change to the high level in response to a clock signal generated by a clock generation circuit (not shown in FIG. 3) that is provided in the RTC 1001. At this time, the RTC 1001 forms the end signal SW2 of low level, and the comparator 1002 forms the common activation signal CS of low level. In this way, each of the switches 1009 and 2105 is put into the ON state and the switch 1010 is turned to the OFF state. Because the switches 1009 and 2105 are turned to the ON state, the state of the sensor 2101 changes to the operating state. Then, the state of each of the comparator 1002, the DA conversion circuit 1003, the holding circuit 1008, and the non-volatile memory 1007 also changes to the operating state. At this time, the switch 1010 is in the OFF state, so that the state of each of the AD conversion circuit 1004, the CPU 1005, and the storage circuit 1006 changes to the non-operating state, namely, to the stop state. When the semiconductor device 1000 is viewed as a so-called microcontroller, it becomes a low power consumption mode.

The sensor data (analog signal: the latest analog data) obtained by sensing by the sensor 2101 is supplied to the holding circuit 1008, held by the holding circuit 1008, and is supplied to the comparator 1002 as indicated by a thick line with an arrow in FIG. 3. Meanwhile, the piece of digital information, for example, based on the digital signal obtained by the previous measurement is stored in the registers 1 and 2 (marked as register 1/2 in the figure, which is the same hereinafter). The piece of digital information stored in the registers 1 and 2 is converted to analog signals by the DA conversion circuit 1003. Then, the analog signals are supplied to the comparator 1002 as the lower and upper limits showing the predetermined voltage range. In other words, the analog data of the previous measurement based on the piece of digital information obtained by the previous measurement is supplied to the comparator 1002.

The comparator 1002 receives the latest analog data from the holding circuit 1008 as well as the previously measured analog data from the DA conversion circuit 1003. The comparator 1002 compares the received previously measured data with the last measured data. Here, the comparison operation of the comparator 1002 is described in detail with reference to FIGS. 4 and 5. Similar to FIG. 2 described above, each of FIGS. 4 and 5 is a schematic view of the configuration, focusing on the sensor 2101, the holding circuit 1008, the comparator 1002, the DA conversion circuit 1003, and the non-volatile memory 1007 of the configuration shown in FIG. 1.

The register 1 (1007-1) of the non-volatile memory 1007 stores the piece of digital information (Min value) obtained by subtracting the value of the tolerance from the piece of digital information obtained in the previous measurement. Further, the register 2 (1007-2) stores the piece of digital information (Max value) obtained by adding the value of the tolerance to the piece of digital information obtained in the previous measurement.

Although not particularly limited, as shown in FIG. 4, the DA conversion circuit 1003 first converts the piece of digital information (Min value) stored in the register 1 (1007-1) into an analog signal and supplies to the comparator 1002. The comparator 1002 compares the voltage of the latest analog data with the voltage of the analog signal corresponding to the piece of digital information (Min value). Next, as shown in FIG. 5, the DA conversion circuit 1003 converts the piece of digital information (Max value) stored in the register 2 (1007-2) into an analog signal and supplies to the comparator 1002. The comparator 1002 compares the voltage of the latest analog data with the voltage of the analog signal corresponding to the piece of digital information (Max value).

In this way, the comparator 1002 compares the latest analog data (the last measured data) that is supplied from the holding circuit 1008 with the previously measured data (the previous analog data). In this case, it is determined whether the last measured data and the previously measured data match within the range of the tolerance. In other words, if the last measured data is within the range between the upper limit (Max value) and the lower limit (Min value) that reflects the tolerance, it is determined that the last measured data is the same as the previously measured data. On the other hand, if the last measured data is out of the range between the upper limit (Max value) and the lower limit (Min value) that reflects the tolerance, it is determined that the last measured data is different from the previously measured data. In the present embodiment, the following process changes depending on the determination of whether the last measured data and the previously measured data are the same or different. Whether the last measured data and the previously measured data are the same or different is shown by the common activation signal CS output from the comparator 1002. Returning to the knowledge of the screening test, the common activation signal CS may also be viewed as the determination signal to determine whether to perform a further detailed test (measurement).

Next, a description will be given of the operation when it is determined that the last measured data is the same as the previously measured data. In other words, it will focus on the operation when the sensor data exists within the tolerance range (predetermined range).

Figure 6:
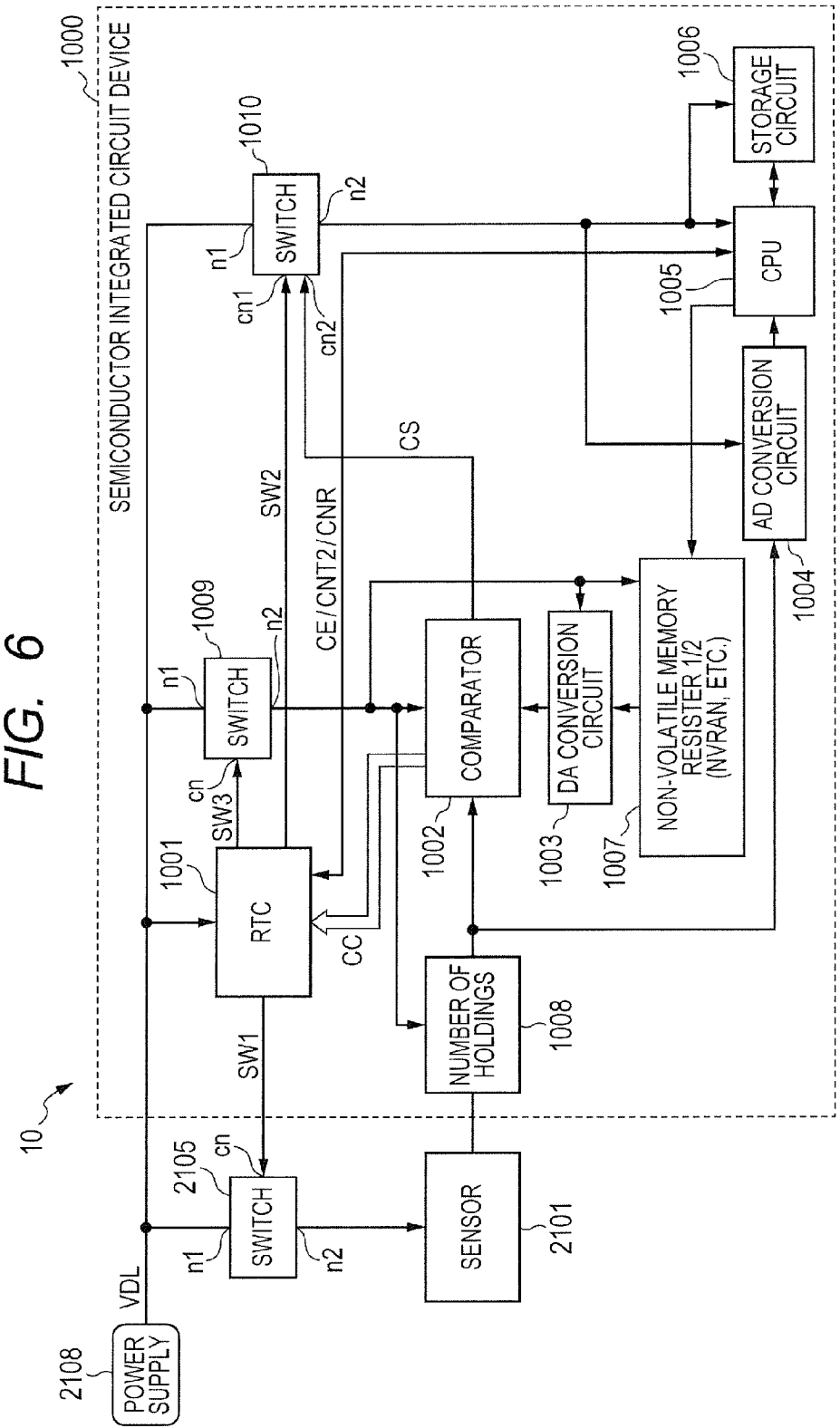
FIG. 6 is a block diagram of the operation of the electronic device according to the first embodiment.
Figure 7:
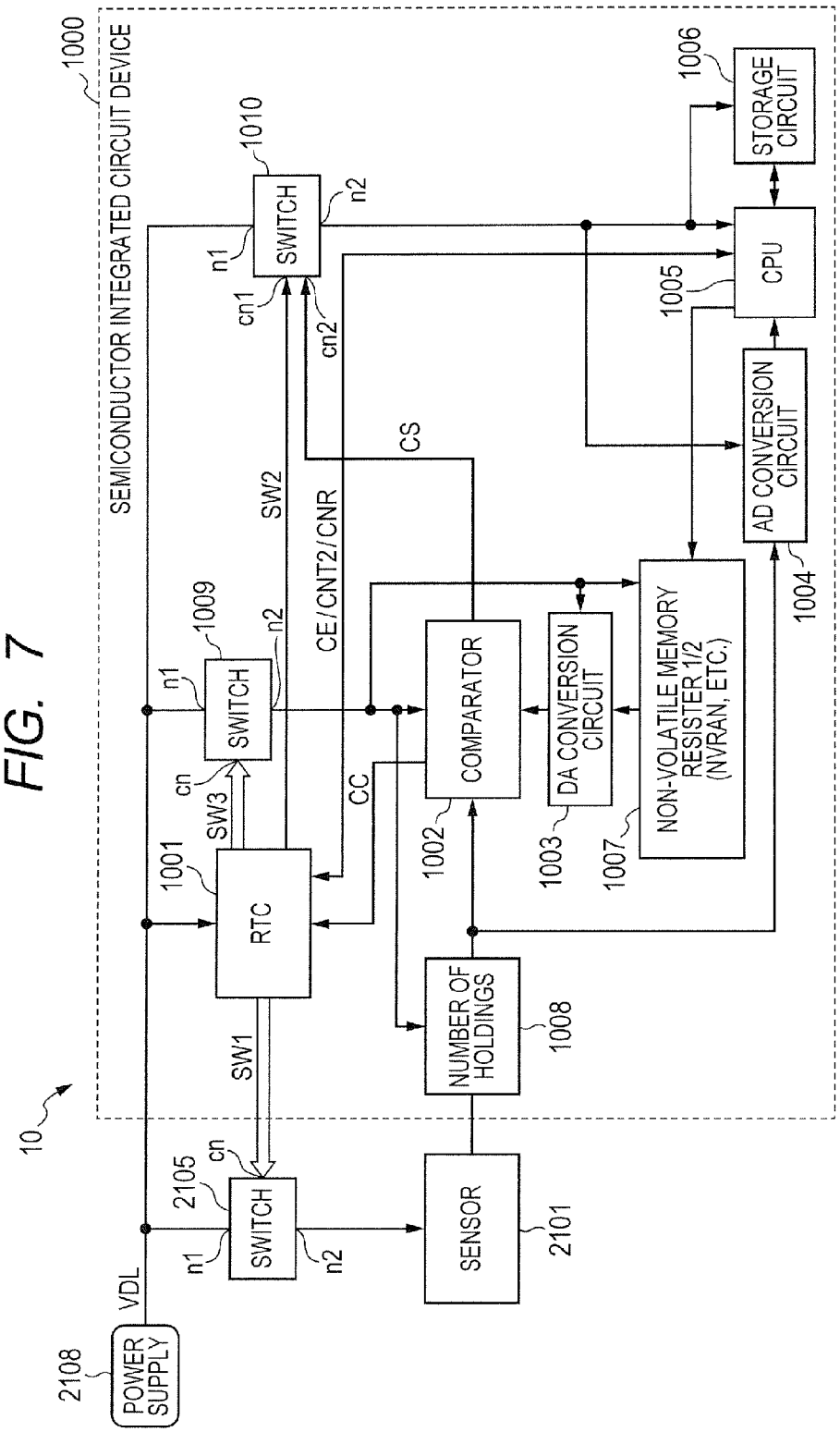
FIG. 7 is a block diagram of the operation of the electronic diagram according to the first embodiment.
Figure 8:
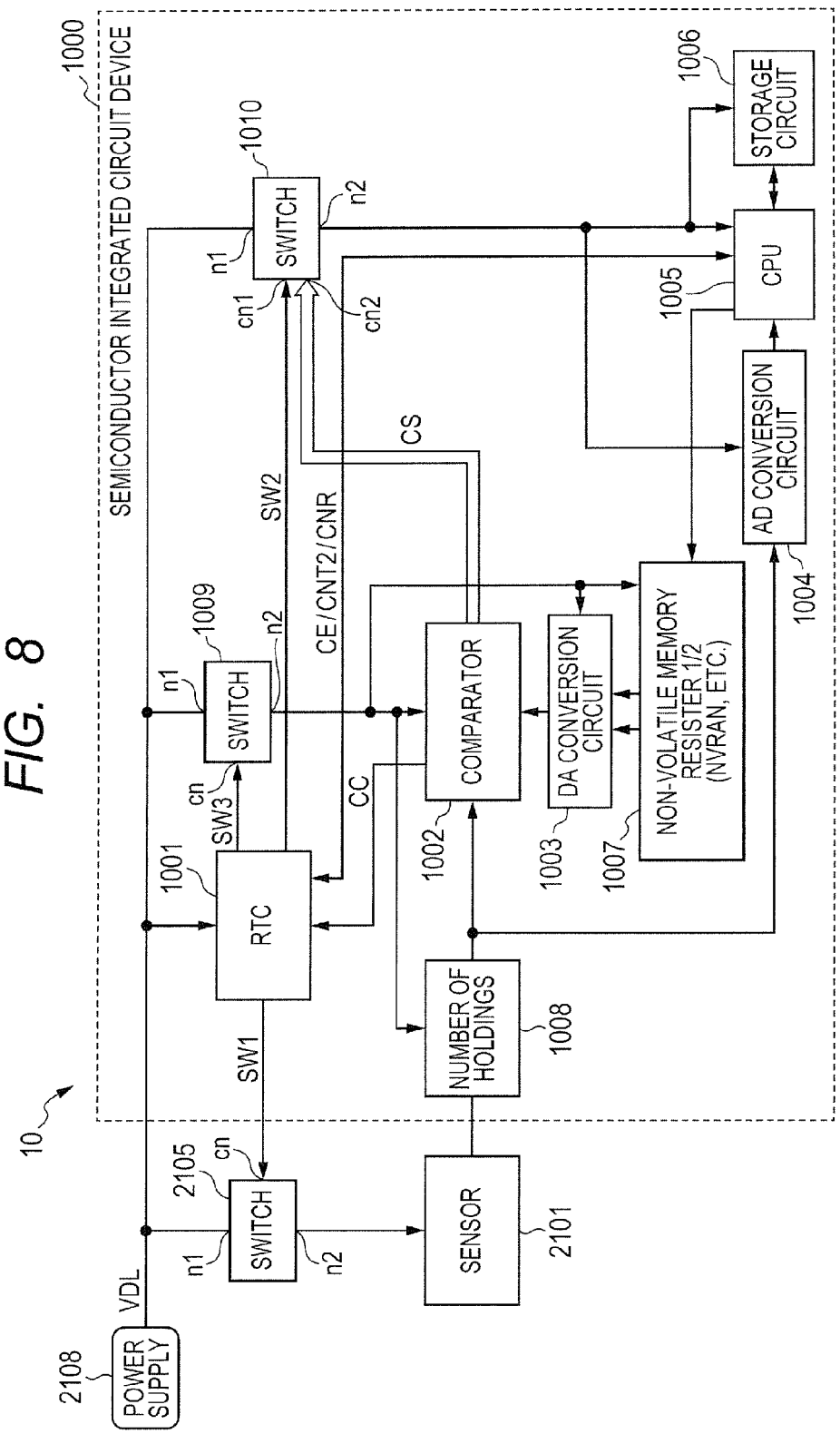
FIG. 8 is a block diagram of the operation of the electronic device according to the first embodiment.
Figure 9:
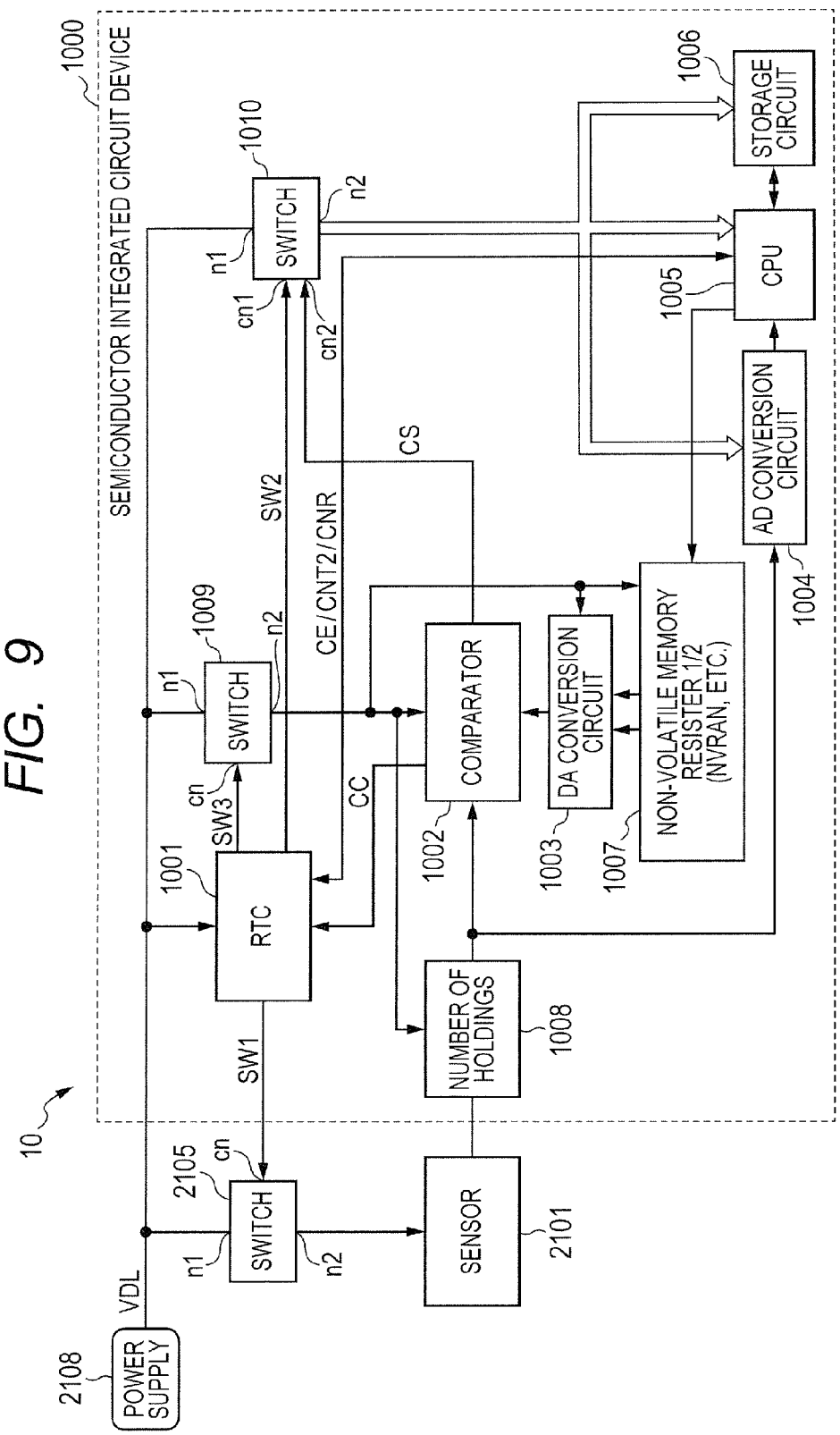
FIG. 9 is a block diagram of the operation of the electronic device according to the first embodiment.

When the last measured data exists within the tolerance range, the comparator 1002 forms the detection signal CC (high level) and supplies to the RTC 1001 as shown by a thick line with an arrow in FIG. 6. In FIG. 7, in response to the detection signal CC, the RTC 1001 changes the first activation signal SW3 and the activation signal SW1 that respectively control the switches 1009 and 2105, as shown by thick lines with arrows in FIG. 7. In other words, the RTC 1001 changes each of the activation signal SW1 and the first activation signal SW3 to the low level. In this way, the state of each of the switches 2105 and 1009 changes from the ON state to the OFF state, thus stopping the power supply of the power supply voltage Vd to the sensor 2101, the comparator 1002, the DA conversion circuit 103, the non-volatile memory 1007, and the holding circuit 1008. In this way, the increase in the power supply is suppressed. Further, at this time, the power supply of the power supply voltage Vd to the AD conversion circuit 1004, the CPU 1005, and the storage circuit 1006 is also stopped, so that the increase in the power consumption can further be suppressed.

When the state shown in FIG. 6 changes to the state shown in FIG. 7, each of the switches 2105, 1009, and 1010 is turned to the OFF state. On the other hand, although described below with reference to FIG. 16, the RTC 1001 is only in operation because the power supply voltage Vd is constantly supplied to the RTC 1001. Since the power supply voltage Vd is supplied to the RTC 1001, the clock generation circuit operates to continue to measure a predetermined time (TC) by using the generated clock signal. The RTC 1001 generates the first activation signal SW3 and the activation signal SW1 each time the predetermined time (TC) has elapsed. For this reason, when the predetermined time (TC) has elapsed from the state shown in FIG. 3, the state shown in FIG. 7 changes again to the state shown in FIG. 3. In other words, as described in FIG. 3, the switches 2105 and 1009 are turned to the ON state to perform again the reception of sensor data from the sensor 2101 as well as the comparison operation by the comparator 1002.

Next, referring to FIGS. 8 to 13, a description will be given of the operation when it is determined that the last measured data is different from the previously measured data. In other words, it will focus on the operation when the sensor data does not exist within the tolerance range (predetermined range). Each of FIGS. 8 to 13 is a view showing the operation when the sensor data does not exists within the tolerance range.

First, in FIG. 3, the comparator 1002 compares the last measured data from the holding circuit 1008 with the previously measured data from the DA conversion circuit 1003. If the last measured data is out of the tolerance range, the comparator 1002 forms the common activation signal CS and supplies to the control node n2 of the switch 1010 as indicated by a thick line with an arrow in FIG. 8. In other words, the common activation signal CS of high level is supplied to the control node n2 of the switch 1010. Then, the state of the switch 1010 changes from the OFF state to the ON state. Because the state of the switch 1010 changes to the ON state, the power supply voltage Vd is supplied to the AD conversion circuit 1004, the CPU 1005, and the storage circuit 1006 through the switch 1010 as indicated by a thick line with an arrow in FIG. 9. In other words, in response to the common activation signal CS, each of the AD conversion circuit 1004, the CPU 1005, and the storage circuit 1006 starts operation.

Figure 10:
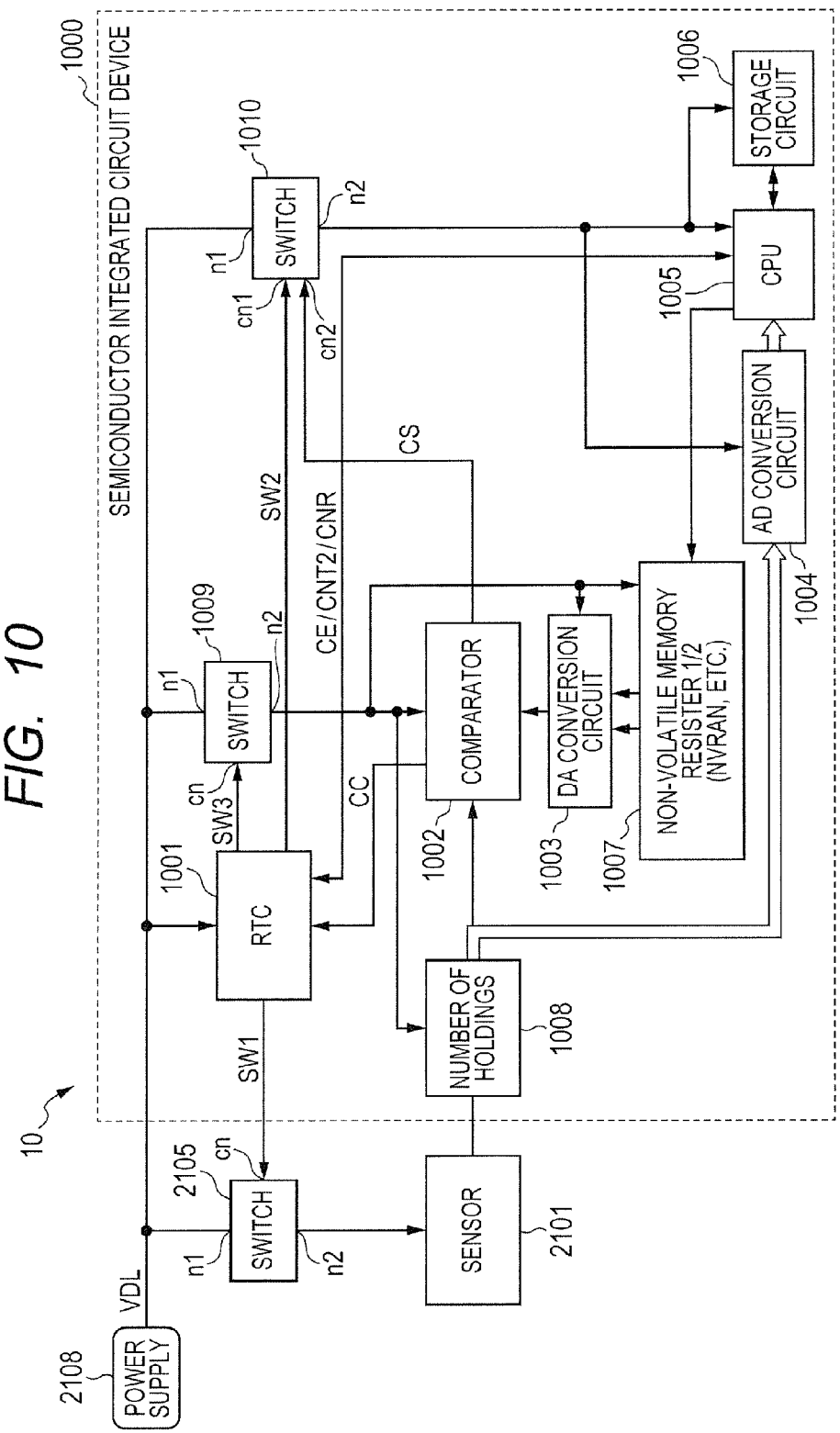
FIG. 10 is a block diagram of the operation of the electronic device according to the first embodiment.
Figure 11:
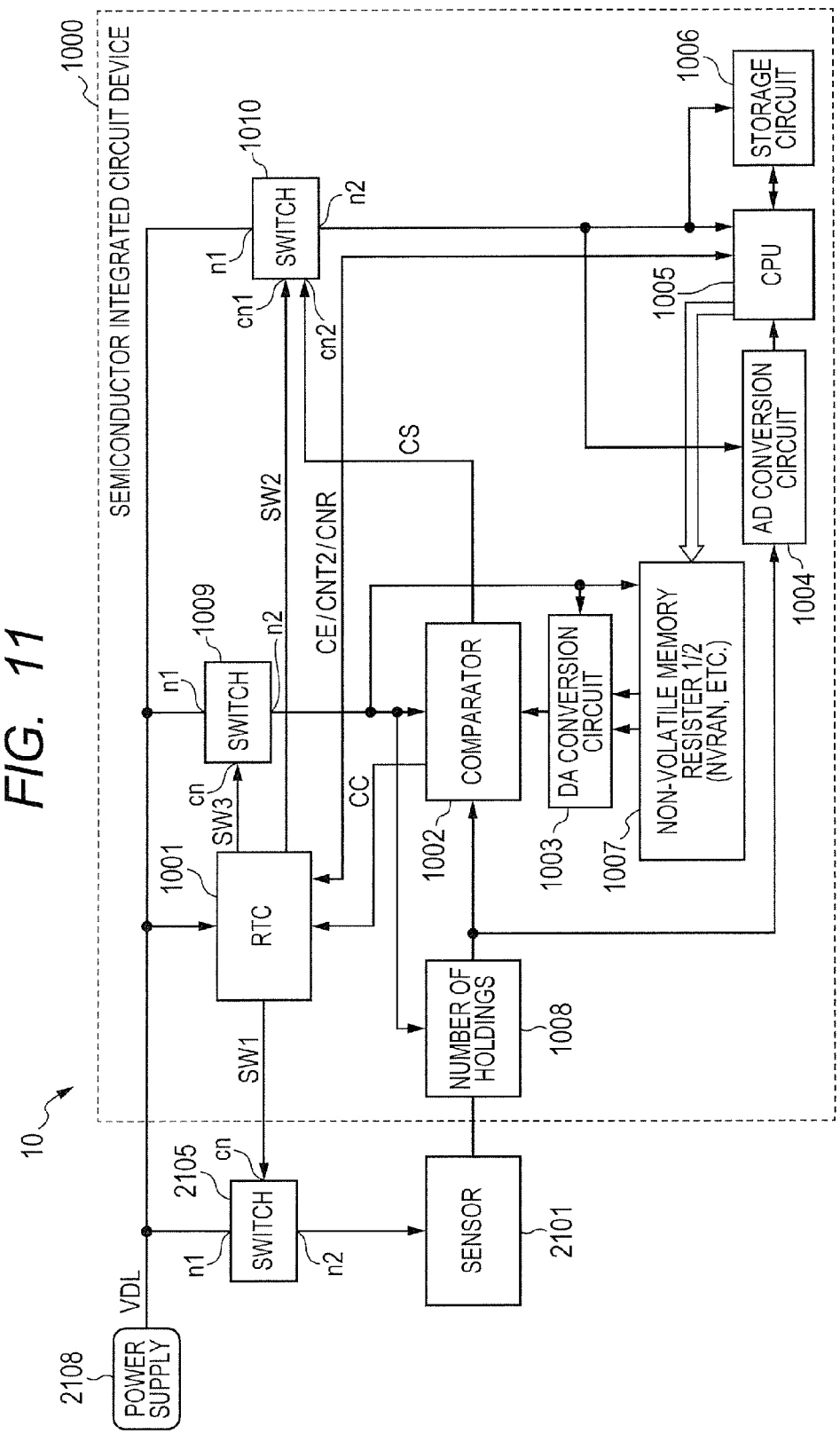
FIG. 11 is a block diagram of the operation of the electronic device according to the first embodiment.

When each of the AD conversion circuit 1004, the CPU 1005, and the storage circuit 1006 starts operation, the power supply voltage Vd is also supplied to the holding circuit 1008, the comparator 1002, the DA conversion circuit 1003, and the non-volatile memory 1007 through the switch 1009. Thus, the last measured data (analog signal) is held by the holding circuit 1008. In this way, the last measured data can be supplied to the AD conversion circuit 1004 from the holding circuit 1008 as shown in FIG. 10.

The AD conversion circuit 1004 converts the last measured data supplied from the holding circuit 1008 into a digital signal, and supplies to the CPU 1005. The CPU 1005 writes the piece of digital information (corresponding to the last measured data) that corresponds to the supplied digital signal into the storage circuit 1006. Further, at the same time, the CPU 1005 obtains the piece of time information CNT2 at this time from the RTC 1001. Then, the CPU 1005 writes the piece of time information CNT2 in the storage circuit 1006, together with the piece of digital information corresponding to the last measured data as a set. Further, the CPU 1005 performs an arithmetic operation in which the tolerance is subtracted or added to the piece of digital information corresponding to the last measured data obtained at this time. In this way, the CPU 1005 obtains the upper limit (Max value) and the lower limit (Min value) with respect to the tolerance range in preparation for the next measurement. The CPU 1005 supplies and writes the obtained lower limit (Min value) and the obtained upper limit (Max value) to the register 1 (1007-1) and the register 2 (1007-2) as indicated by a thick line with an arrow in FIG. 11. Here, the lower limit (Min value) and the upper limit (Max value), which are written in the registers 1 and 2, will be used as the previously measured data in the next measurement.

Figure 12:
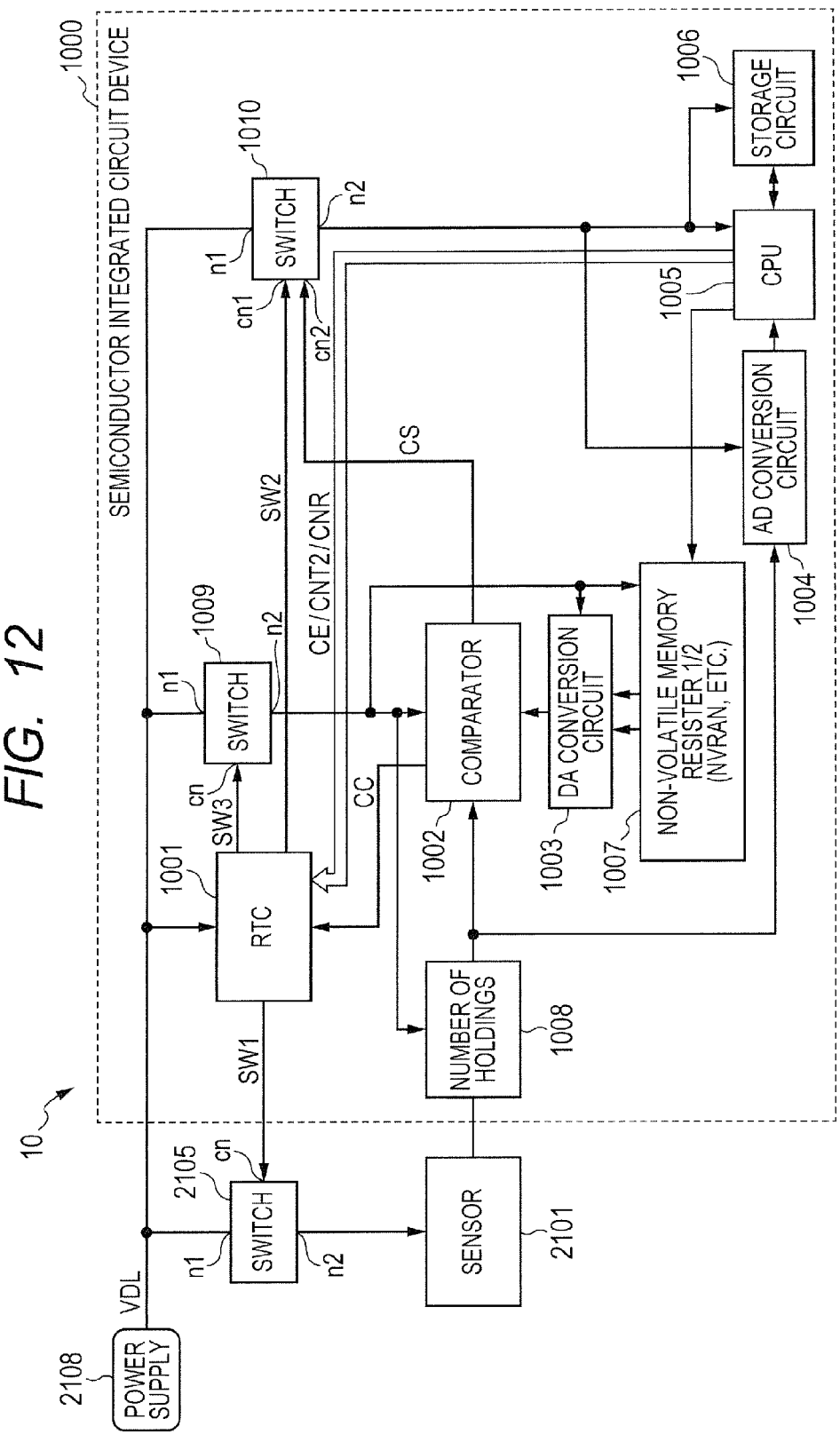
FIG. 12 is a block diagram of the operation of the electronic device according to the first embodiment.
Figure 13:
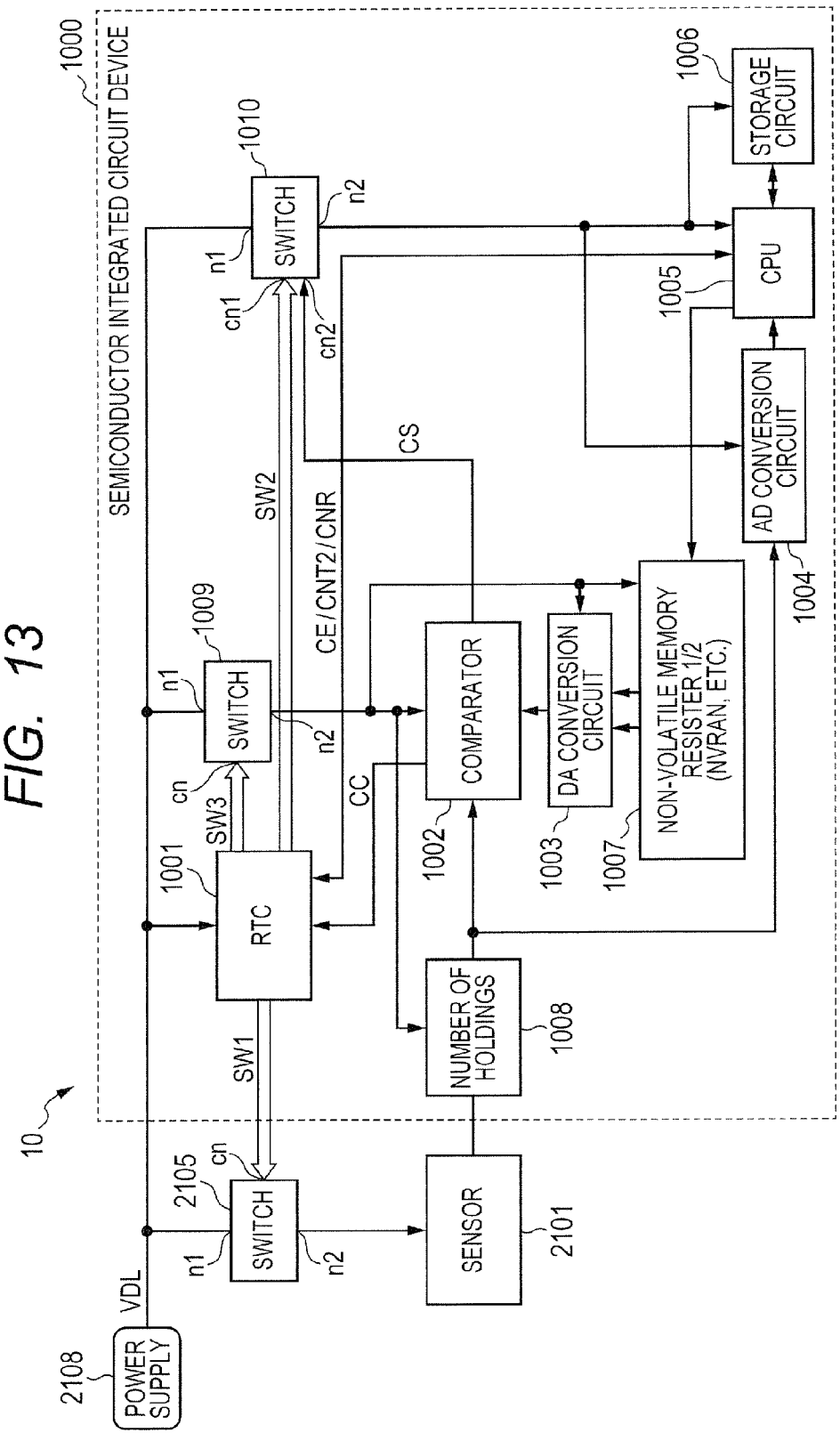
FIG. 13 is a block diagram of the operation of the electronic device according to the first embodiment.

When the lower and upper limits are written in the registers 1 and 2, the CPU 1005 forms the completion signal CE and supplies to the RTC 1001 as indicated by a thick line with an arrow in FIG. 12. The RTC 1001 receives the completion signal CE, and changes the end signal SW2, activation signal SW1, and the first activation signal SW3 as indicated by thick lines with arrows in FIG. 13. In other words, the RTC 1001 changes the end signal SW2 to the high level while changing each of the activation signal SW1 and the first activation signal SW3 to the low level. In this way, the state of each of the switches 1010, 2105, and 1001 changes from the ON state to the OFF state. Since the respective switches are turned to the OFF state, the power supply of the power supply voltage Vd to each of the sensor 2101, the comparator 1002, the DA conversion circuit 1003, the non-volatile memory 1007, the AD conversion circuit 1004, the CPU 1005, and the storage circuit 1006 is stopped. In this way, the semiconductor device 1000 is stopped or moves to the low power consumption mode.

Even when the power supply of the power supply voltage Vd to the respective circuit blocks is stopped, the power supply to the RTC 1001 is continued. Thus, the RTC 1001 continues to measure the time. Then, when the predetermined time (TC) has elapsed, the RTC 1001 forms the activation signal SW1 and the first activation signal SW3. In this way, the semiconductor device 1000 returns to the state of FIG. 3 to perform again the reception of the sensor data from the sensor 2101 as well as the comparison operation by the comparator 1002.

<Flow Chart of the Operation of Electronic Device and Semiconductor Device>

Figure 14:
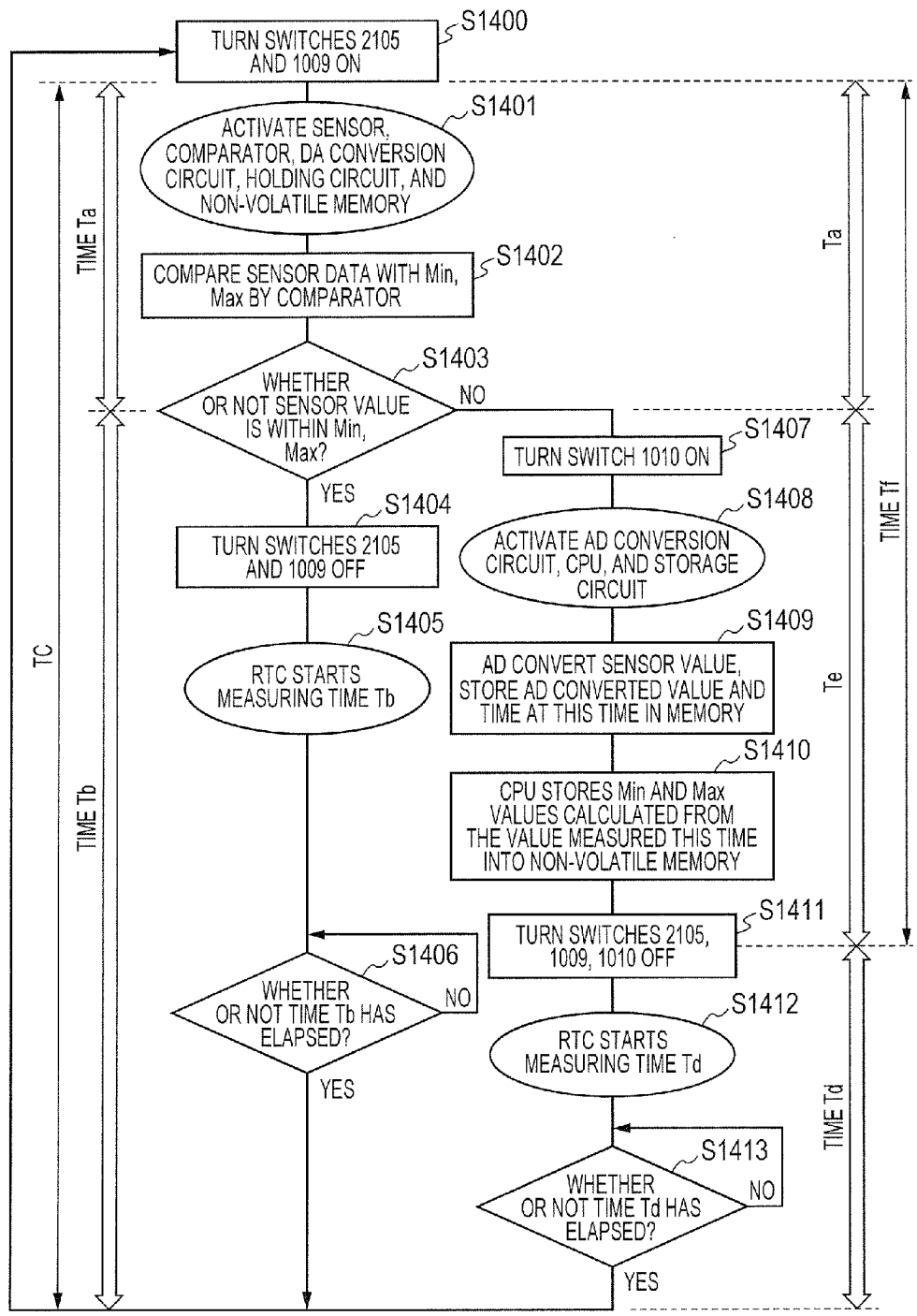
FIG. 14 is a flow chart showing the operation of the electronic device according to the first embodiment.

FIG. 14 is a flow chart of the operation described with reference to FIGS. 3 to 13. The steps to be performed are marked as steps S1400 to S1413 in the middle part of FIG. 14. Then, the time of the steps to be performed when the sensor data exists within the tolerance range is shown in the left side of the figure. Further, the time of the steps to be performed when the sensor data does not exist within the tolerance range is shown in the right side of FIG. 14.

In step S1400, the RTC 1001 changes the switches 2105 and 1009 to the ON state (FIG. 3). In this way, in step S1401, the sensor 2101, the comparator 1002, the DA conversion circuit 1003, the holding circuit 1008, and the non-volatile memory 1007 are activated. Each of the sensor 2101, the comparator 1002, the DA conversion circuit 1003, the holding circuit 1008, and the non-volatile memory 1007 is activated and starts operation. In step S1402, the comparator 1002 compares the sensor data held in the holding circuit 1008 with the previous Min and Max values from the non-volatile memory 1007. Based on this comparison, the determination of whether the value of the sensor data (sensor value) is in the range between the Min value and the Max value is performed in step S1403.

In step S1403, when it is determined that the sensor value exists within the range (tolerance range) between the Min value and the Max value (Yes), the steps are performed in the order of steps S1404, S1405, and S1406. On the other hand, when it is determined that the sensor value does not exist within the range (tolerance range) between the Min value and the Max value (No), steps S1407 to S1413 are performed in series. In other words, steps S1400 to S1403 are performed regardless of whether the sensor value exists within the tolerance range. The time required for step S1400 is short, so that the time required for performing the common steps S1400 to S1403 is marked as time Ta.

In step S1403, when it is determined that the sensor value exists within the tolerance range, the RTC 1001 turns the switches 2105 and 1009 to the OFF state in step S1404. Further, the RTC 1001 starts measuring the time in step S1405. In this case, the time to be measured is time Tb. After starting the measurement of the time, the RTC 1001 repeats step S1406 until the time Tb has elapsed. When the time Tb has elapsed, the RTC 1001 performs step S1400 again. In other words, the RTC 1001 turns the switches 2105 and 1009 to the ON state again.

When the sensor value exists within the tolerance range, the switches 2105 and 1009 are in the OFF state during the time Tb. Further, the switch 1010 is not also changed to the ON state, so that the power supply of the power supply voltage Vd to the comparator 1002, the DA conversion circuit 1003, the holding circuit 1008, the non-volatile memory 1007, the AD conversion circuit 1004, the CPU 1005, and the storage circuit 1006 is stopped. Thus, in this case, an increase in the power consumption can be suppressed during the time Tb.

In the present embodiment, the switch 2105 is turned to the ON state periodically for the time which is the sum of the times Ta and Tb (Ta+Tb) as the period. Thus, the temperature is measured periodically with the period (Ta+Tb) as one cycle.

On the other hand, when the sensor value does not exist within the tolerance range, the comparator 1002 changes the switch 1010 to the ON state in step S1407. Since the switch 1010 changes to the ON state, the power supply voltage Vd is supplied to the AD conversion circuit 1004, the CPU 1005, and the storage circuit 1006. Then, each of the AD conversion circuit 1004, the CPU 1005, and the storage circuit 1006 is activated in step S1408. Since the circuit blocks are activated in step S1409, the AD conversion circuit 1004 AD converts the sensor value held in the holding circuit 1008. Then, in step S1409, the CPU 1005 writes the AD converted sensor value (digital signal) into the storage circuit 1006. Further, the CPU 1005 fetches the piece of time information CNT2 at this time from the RTC 1001, and writes (stores) the piece of time information CNT2 into the storage circuit 1006, together with the sensor value (digital signal) as a set.

Next, in step 1410, the CPU 1005 calculates the Min value and the Max value by adding and subtracting the tolerance to and from the sensor value (digital signal) as the value that is measured this time. Then, the CPU 1005 writes the calculated Min and Max values into the non-volatile memory 1007. In other words, the CPU 1005 writes the Min value in the register 1 (1007-1) of the non-volatile memory 1007 and the Max value in the register 2 (1007-2) of the non-volatile memory 1007.

A series of steps of the CPU 1005 is completed after the execution of steps S1409 and 1410. After performing step 1410, the CPU 1005 supplies the completion signal CE to the RTC 1001. Although not particularly limited, the completion signal CE is supplied from the CPU 1005 to the RTC 1001 in step 1410. When receiving the completion signal CE, in step S1411, the RTC 1001 changes each of the switches 2105, 1009, and 1010 to the OFF state in response to the completion signal CE.

After changing the switches 2105, 1009, and 1010 to the OFF state, the RTC 1001 starts measuring the time in step S1412. In this case, the time is Td. The RTC 1001 repeats step S1413 until the time Td has elapsed. When the time Td has elapsed, step 1400 is performed again.

The time Td is shorter than the time Tb that is described above. Because each of the switches 2105, 1009, and 1010 is turned to the OFF state, the power supply of the power supply voltage Vd to each of the comparator 1002, the DA conversion circuit 1003, the holding circuit 1008, and non-volatile memory 1007, the AD conversion circuit 1004, the CPU 1005, and the storage circuit 1006 is stopped during the time Td. Thus, an increase in the power consumption can be suppressed during the time Td.

In FIG. 14, the time when steps S1407 to S1411 (until the switches 2105, 1009, and 1010 are turned to the OFF state) are performed is shown as Te. During the time Te, each of the switches 2105, 1009, and 1010 is in the ON state. In the present embodiment, for example, the time Tb or Td is set so that the time of the sum of the times Te and Td (Te+Td) is equal to the time Tb. In this way, even in the case in which the sensor value does not exist within the tolerance range (in other words, when the sensor value is out of the tolerance range), the cycle of sensing the temperature by the sensor 2101 is the same as the case in which the sensor value exists within the tolerance range. Note that in FIG. 14, the time of the sum of the times Ta and Te is shown as Tf, and the time of the sum of the times Ta and Tb, in other words, the time of the sum of the times Tf and Td is shown as time TC.

Figure 18:
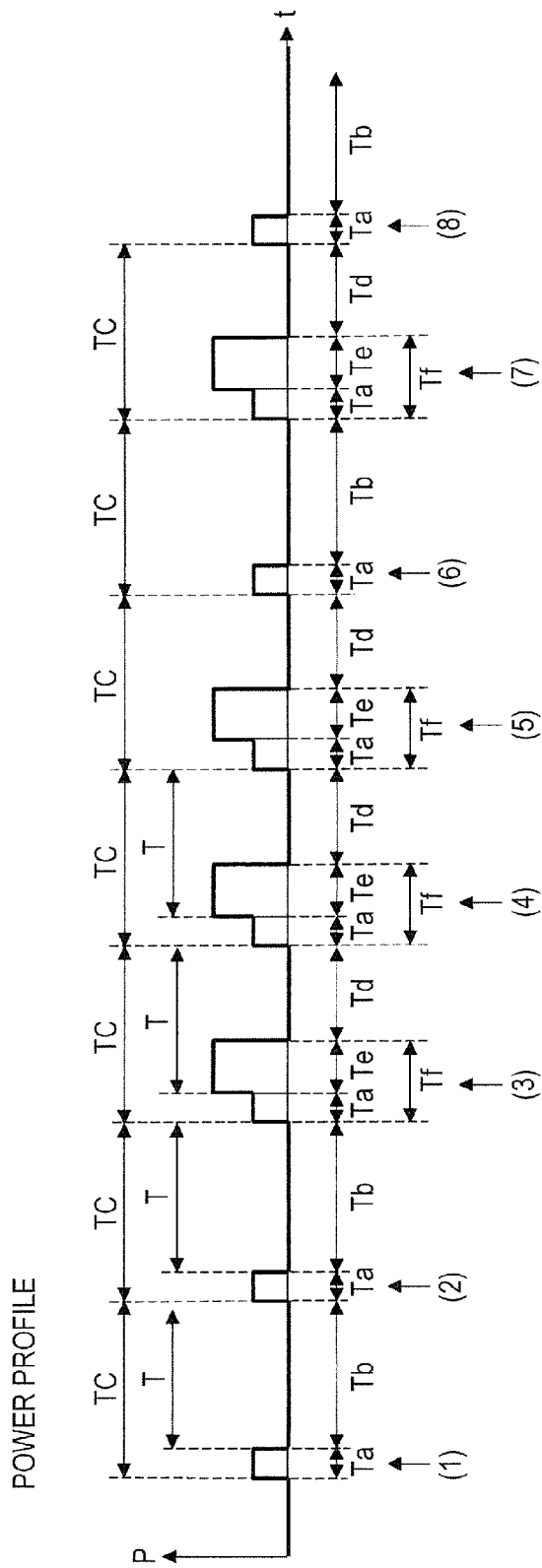
FIG. 18 is a diagram showing the power profile of the electronic device according to the first embodiment.

FIG. 18 is a diagram showing the power profile of the electronic device according to this embodiment. Similar to the power consumption profile in FIG. 20 described above, in FIG. 18, the horizontal axis represents the time t and the vertical axis represents the power consumption P of the electronic device 10. Each of TC, Ta, Tb, Td, Te, and Tf shown in FIG. 18 represents the time, which corresponds to each of the times TC, Ta, Tb, Td, Te and Tf shown in FIG. 14.

Figure 19:
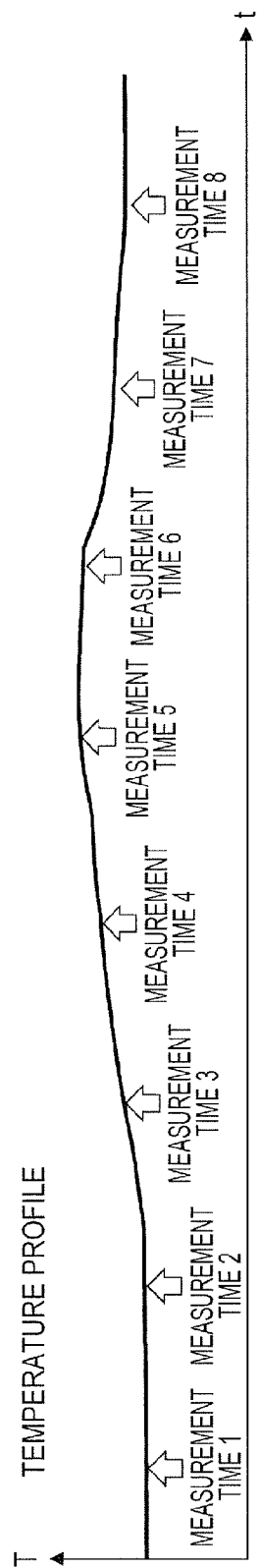
FIG. 19 is a diagram showing the temperature profile.

Further, in FIGS. 18, (1) to (8) represent the measurement times 1 to 8 shown in FIG. 19. For example, (1) in FIG. 18 represents the measurement time 1 shown in FIGS. 19, and (3) represents the measurement time 3 shown in FIG. 19. In other words, at the time Ta in (1) shown in FIG. 18, the temperature at the measurement time 1 shown in FIG. 19 is sensed by the sensor 2101. Then, the sensor data at this time is compared in step S1402 shown in FIG. 14. Similarly, at the time Ta in (3) shown in FIG. 18, the temperature at the measurement time 3 shown in FIG. 19 is sensed by the sensor 2101. Then, the sensor data at this time is compared in step S1402 shown in FIG. 14. This is the same for the remaining measurement times 2, and 4 to 8.

FIG. 18 shows an example in which the sensor data (sensor value) at each of the measurement times 1, 2, 6, and 8 exists within the range (tolerance range) between the Min value and the Max value that are obtained by the previous measurement. Further, it also shows an example in which the sensor data in each of the measurement times 3 to 5 and 7 does not exist within the tolerance range between the Min value and the Max value that are obtained in the previous measurement. Thus, in FIG. 18, the time TC in (1), (2), (6), and (8) corresponding to the measurement times 1, 2, 6, and 8, is configured by the times Ta and Tb in which steps S1400 to S1406 shown in FIG. 14 are performed. On the other hand, in FIG. 18, the time TC in each of (3) to (5) and (7) corresponding to the measurement times 3 to 5 and 7 is configured by the times Ta, Te, and Td in which steps S1400 to 1403 and S1407 to S1413 shown in FIG. 14 are performed.

In FIGS. 18 and 19, the previous measurement at the measurement time 2 corresponds to the measurement time 1. However, at the measurement time 1, the Min and Max values corresponding to the sensor data are not obtained. For this reason, the measurement performed at the time prior to the measurement time 1 is the previous measurement. Thus, it is to be understood that the previous measurement includes not only the previous measurement but also the measurement that was performed earlier.

Figure 20:
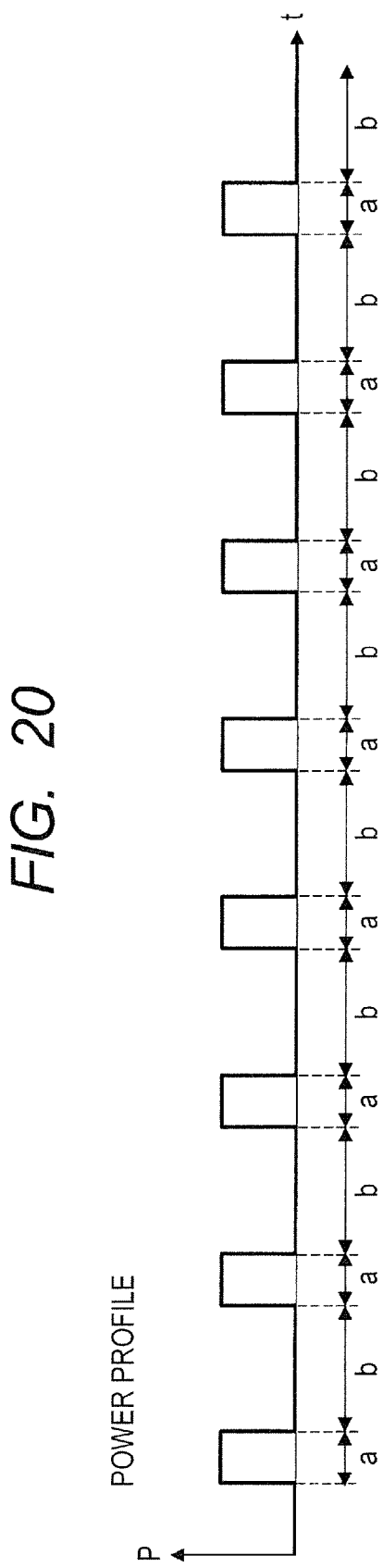
FIG. 20 is a diagram showing the power profile of the electronic device discussed earlier.
Figure 21:
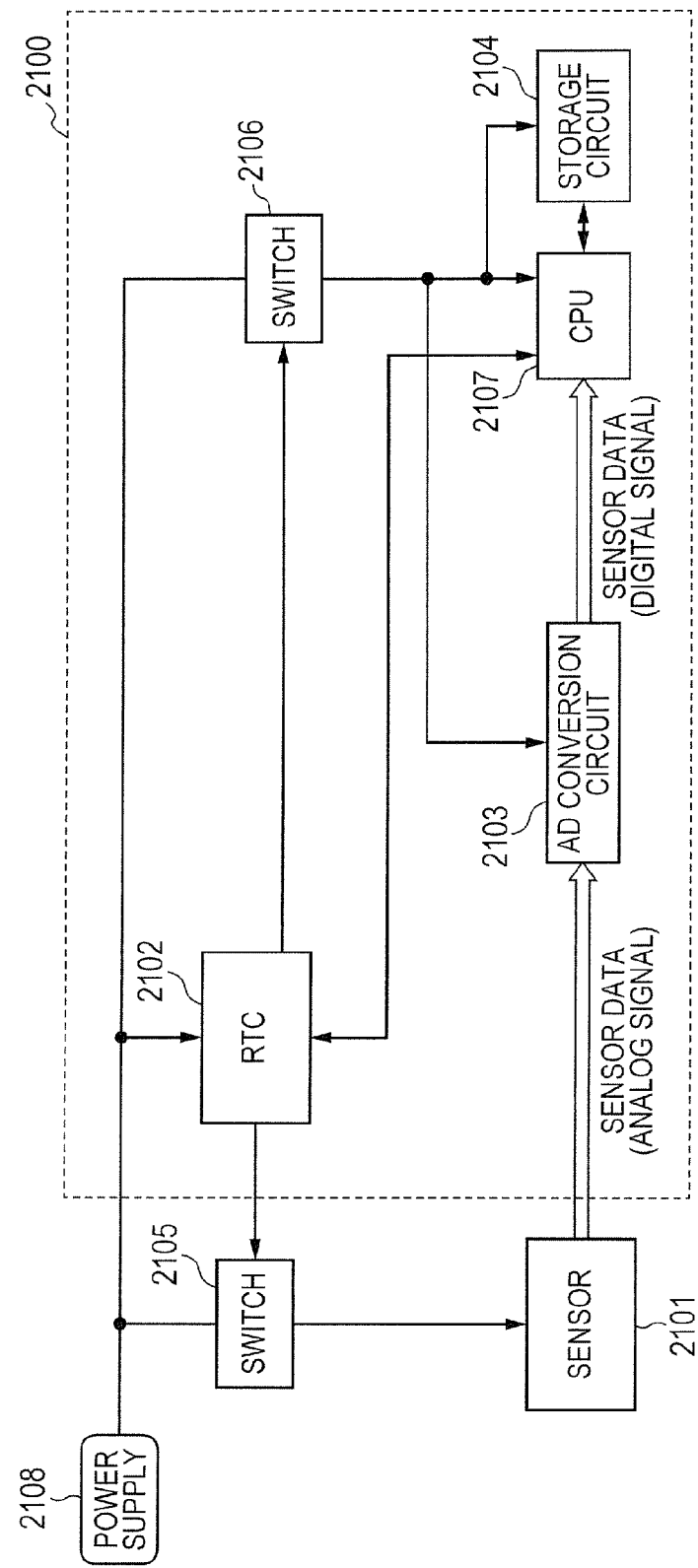
FIG. 21 is a block diagram showing the configuration of the electronic device discussed earlier.

Further, when comparing FIG. 20 and FIG. 18 described above, the times Ta and Tb or the times Ta, Te, Td, which configure the time TC, are set so that the sum of the times of a and b shown in FIG. 20 is equal to the time TC shown in FIG. 18. In this way, it is possible to sense the temperature at the same time interval (TC) as shown in FIG. 20. Here, as can be understood from the description with reference to FIG. 14, the time Ta is the time mainly used when the comparator 1002 compares the sensor data with the tolerance range (Min value, Max value). Further, the time Te includes the time required for AD conversion performed by the AD conversion circuit 1004, the time required for obtaining the piece of time information at this time, the time for calculating the Min and Max values showing the tolerance range, and the time required for writing the Min and Max values into the storage circuit 1006. Further, the times Tb and Td are the times when the circuit blocks except the RTC 1001 (which are the sensor 2101, the comparator 1002, the DA conversion circuit, the non-volatile memory 1007, the AD conversion circuit 1004, the CPU 1005, and the storage circuit 1006 in the present embodiment) are in the non-operating state, during which the semiconductor device 1000 is in the lower power consumption mode.

In the present embodiment, TC is the measurement cycle to measure the temperature. The time allocation in the measurement cycle (period) changes depending on whether the sensor data exists within the tolerance range (predetermined range). In other words, the time allocation in the sensing changes in the sensing method for sensing.

In other words, the period TC has a first period (Ta) for determining whether the value of the sensor data (analog input signal) exists within a predetermined range, as well as a second period (Tb or Td) in which the circuit blocks except the RTC are in the non-operating state. In the first period (Ta), when it is determined that the value of the senor data does not exist within the predetermined range, a third period (Te) is inserted into the period TC and the second period is shortened (Td). In the third period (Te), the processing circuit, including the CPU 1005 and the storage circuit 1006, operates to hold the piece of digital information corresponding to the sensor data into the storage circuit 1006. In addition, in the present embodiment, the AD conversion circuit 1004 operates to form a digital signal corresponding to the sensor data in the third period (Te).

When comparing the power consumption profile shown in FIG. 20 with the power consumption profile shown in FIG. 18, according to the present embodiment, it is possible to suppress an increase in the power consumption when the periods (TC) are set to the same length and have the same cycle. In other words, in FIG. 20, the time a constantly occurs, and the operation of AD conversion of sensor data, as well as the operation of the CPU to write the digital signal obtained by the AD conversion operation into the storage circuit are performed at the time a. As a result, the power consumption is increased.

On the other hand, in the present embodiment, the comparison operation by the comparator 1002 is only performed at the time Ta. Thus, for example, the power consumption can be only about half the power consumption at the time a (FIG. 20). Further, the time during the comparator 1002 operates is also short, so that, for example, the time Ta can be for example only about half the time a. Thus, the amount of power consumed at the time Ta in FIG. 18 is, for example, about one fourth the amount of power consumed at the time a in FIG. 20.

Similar to the case at the time a shown in FIG. 20, the AD conversion circuit 1004, the CPU 1005, and the storage circuit 1006 operate at the time Te shown in FIG. 18. In this case, the amount of operation of the CPU 1005 is increased by the amount of the calculation performed to obtain the tolerance range at the time Te. However, the calculation is simple, and an increase in the power consumption due to this amount of operation can be ignored. Further, the power supply to the comparator 1002, the DA conversion circuit 1003, the holding circuit 1008, and the non-volatile memory 1007 is also performed at the time Te. However, the comparison operation is completed at the time Ta and the state of these circuits is nearly unchanged. For this reason, the increase in the power consumption can be ignored even when the power supply is performed. Thus, the amount of power consumption at the time Te shown in FIG. 18 is approximately the same as the amount of power consumption at the time a in FIG. 20. Further, the RTC 1001 operates both in FIG. 20 and FIG. 18, but the amount of power consumption is small and is omitted.

<Configuration and Operation of the RTC 1001>

Next, an example of the RTC 1001 will be described. FIG. 16 is a block diagram showing the configuration of the RTC 1001. The RTC 1001 is constantly supplied with the power supply voltage Vd and the ground voltage Vs from the power supply 2108 (FIG. 1). In FIG. 16, VDLI represents the internal power supply line to which the power supply voltage Vd is supplied through the power supply line VDL (FIG. 1). Further, VSLI represents the internal ground line to which the ground voltage Vs is supplied through the ground line (not shown) from the power supply 2108. Each of the internal power supply line VDLI and the internal ground line VSLI is coupled to each of the circuits in the RTC 1001, which will be descried below. The power supply voltage Vd and the ground voltage Vs are supplied as the operation voltage to the respective circuits.

The RTC 1001 includes a clock generation circuit 1600 (CKG), two counters 1601 (CNT1) and 1602 (CNT2), and a control circuit 1603 (RTC_CTL). Due to the supply of the operation voltage (power supply voltage Vd, ground voltage Vs), the clock generation circuit 1600 generates a clock signal of a predetermined frequency. The clock signal generated by the clock generation circuit 1600 is supplied to the counter 1601.

The counter 1601 counts the clock signal from the clock generation circuit 1600, and supplies the counted value (count value) to the control circuit 1603. Further, a reset signal is supplied to the counter 1601 from the control circuit 1603. Due to the supply of the reset signal from the control circuit 1603, the counter 1601 resets the count value to a predetermined value. After the reset, the counter 1601 counts again the clock signal from the clock generation circuit 1600 and supplies the count value to the control circuit 1603. Further, in response to the reset, the counter 1601 supplies a clock signal to the counter 1602. The counter 1602 counts the clock signal supplied from the counter 1601.

As described above, the counter 1601 is reset each time the reset signal is supplied from the control circuit 1603 to resume counting the clock signal. The clock signal is supplied to the counter 1602 each time the counter 1601 is reset, and then the counter 1602 counts the clock signal. Thus, the count value of the counter 1602 is the piece of time information CNT2 (FIG. 1) based on the number of resets of the counter 1601. The CPU 1005 is coupled to the counter 1602, and obtains the piece of time information CNT2, based on the number of resets of the counter 1601, from the counter 1602 in step S1409 shown in FIG. 14. Note that the counter 1601 is also coupled to the CPU 1005. In this way, the CPU 1005 is operable to reset each of the counters 1601 and 1602, and to supply signals or data CNR (FIG. 1) to set a predetermined value to each of the counters 1601 and 1602.

The control circuit 1603 receives the count value from the counter 1601, the detection signal CC from the comparator 1002, and the completion signal CE form the CPU 1005. Then, based on these signals and the value, the control circuit 1603 generates the reset signal, the activation signal SW1, the end signal SW2, and the first activation signal SW3. The operation of the control circuit 1603 is described as follows based on the flow chart shown in FIG. 14.

First, in step S1400 (FIG. 14), the control circuit 1603 supplies a reset signal to the counter 1601. Further, at this time, the control circuit 1603 changes each of the activation signal SW1 and the first activation signal SW3 to the high level, and the end signal SW2 to the low level. In this way, the counter 1601 starts counting the clock signal, and the switches 2105 and 1009 (FIG. 1) are turned to the ON state.

Next, in step S1403, the control circuit 1603 determines the voltage of the detection signal CC. When the detection signal CC is the high level, the control circuit 1603 changes each of the activation signal SW1 and the first activation signal SW3 to the low level. In this way, the switches 2105 and 1009 are turned to the OFF state (step S1404). Further, the control circuit 1603 starts measuring the time Tb with the count value at this time from the counter 1601 as the default value (step S1405).

Although not particularly limited, in the present embodiment, the control circuit 1603 previously stores the count values corresponding to each of the times Tb and Td described in FIGS. 14 and 18 in advance. More specifically, a storage circuit (not shown) is provided in the control circuit 1603, and the count values corresponding to each of the times Tb and Td are set in advance in the storage circuit by the CPU 1005. In this way, it is possible to arbitrary set the times Td and Tb. The control circuit 1603 keeps the activation signal SW1 and the first activation signal SW3 at low level until the count value from the counter 1601 reaches the count value corresponding to the Time Tb from the default value (step S1406). Then, when the count value from the counter 1601 reaches the count value corresponding to the time Tb from the default value, the control circuit 1603 changes each of the activation signal SW1 and the first activation signal SW3 to the high level. In this way, the semiconductor device returns to the state of step S1400.

On the other hand, when the detection signal CC is low level in step S1403, the control circuit 1603 keeps each of the activation signal SW1 and the first activation signal SW3 at high level. At this time, the common activation signal CS from the comparator 1002 is supplied to the control node n2 of the switch 1010, so that the switch 1010 is turned to the ON state. Then, steps S1407 to S1410 shown in FIG. 14 are performed. When the CPU 1005 completes a series of steps in step S1410, the completion signal CE is supplied to the control circuit 1603 from the CPU 1005. When receiving the completion signal CE, the control circuit 1603 changes each of the activation signal SW1 and the first activation signal SW3 to the low level, and changes the end signal SW2 to the high level. In this way, each of the activation signal SW1 and the first activation signal SW3 is turned to the OFF state (step S1411). Further, the control circuit 1603 starts measuring the time Td with the count value at this time from the counter 1601 as the default value (step S1412).

The control circuit 1603 changes each of the activation signal SW1 and the first activation signal SW3 to the low level until the count value from the counter 1601 reaches the count value corresponding to the time Td from the default value. Then, the control circuit 1603 changes the end signal SW2 to the high level to keep the OFF state of the switches 2105, 1009, and 1010 (step S1413). Note that, as described above, the count value corresponding to the time Td is stored in the storage circuit not shown.

When the count value of the counter 1601 reaches the count value corresponding to the time Td from the default value, the control circuit 1603 generates a reset signal for the counter 1601 to change each of the activation signal SW1 and the first activation signal SW3 to the high level. Then, the semiconductor device returns to the state of step S1400 in FIG. 14.

After that, the above operation is repeated. When the reset signal is supplied from the control circuit 1603 to the counter 1601, the clock signal is supplied from the counter 1601 to the counter 1602. At this time, the counter 1602 counts the number of resets of the counter 1601. Thus, in step S1409, the count value of the counter 1602 can be used as the piece of time information CNT2.

In the above description, the measurement of the time Tb and the time Td is performed by determining whether the count value of the counter 1601 reaches the count value corresponding to the times Tb and Td with the count value of the counter 1601 at this time as the default value. However, the present invention is not limited to this example. In this case, for example, the difference between the default value and the count value corresponding to the time Tb (Td) is stored in advance in the storage circuit, not shown, so as to be able to determine whether the count value of the counter 1601 reaches the time Tb (Td) based on whether the count value of the counter 1601 reaches the difference. However, for example, it is also possible to store the count value corresponding to the time TC into the storage circuit not shown, to determine whether the count value of the counter 1601 reaches the count value corresponding to the time TC, and to perform step S1400 when the count value of the counter 1601 reaches the time TC. In this case, although it is difficult to arbitrary set the time Tb and the time Td, the control circuit 1603 can be simplified.

<Configuration and Operation of the Comparator 1002>

Figure 17:
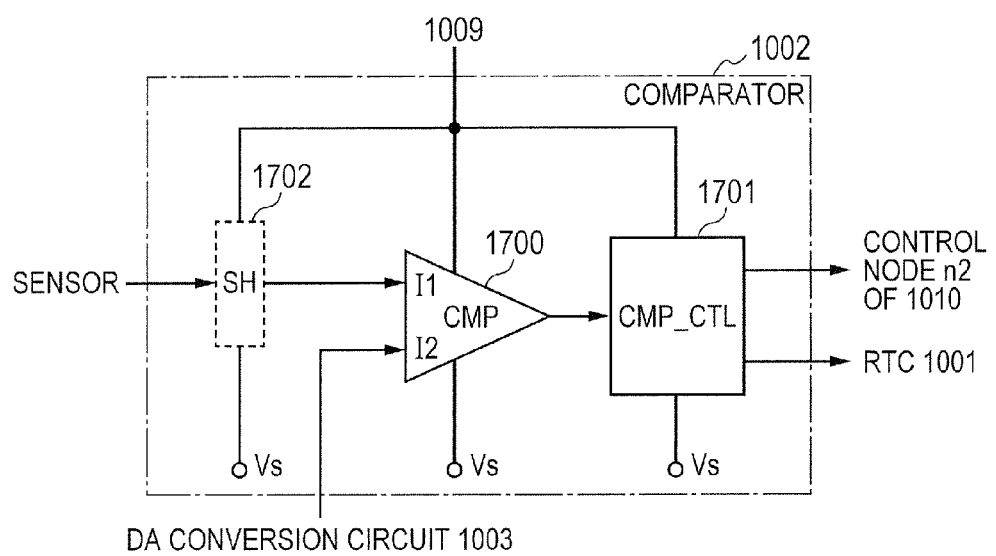
FIG. 17 is a block diagram showing the configuration of a comparator provided in the semiconductor device according to the first embodiment.

FIG. 17 is a block diagram showing the configuration of the comparator 1002. FIG. 17 also shows the configuration of a variation by a dashed line, which will be described below. First, the configuration is described except for the dashed line portion related to the variation.

The comparator 1002 includes a comparator circuit 1700 (CMP) and a control circuit 1701 (CMP_CTL). Each of the comparator circuit 1700 and the control circuit 1701 is supplied with the ground voltage Vs, as well as the power supply voltage Vd through the switch 1009. Then, the comparator circuit 1700 and the control circuit 1701 are operable with the power voltage Vd and the ground voltage Vs as the operation voltage. In other words, when the switch 1009 is turned to the ON state, the power supply voltage Vd is supplied to the comparator circuit 1700 and the control circuit 1701, and then each of the comparator circuit 1700 and the control circuit 1701 operates. In the present specification, the comparator 1002 is shown as a representative example. However, the other circuit blocks (the DA conversion circuit 1003, the non-volatile memory 1007, the holding circuit 1008, the AD conversion circuit 1004, the CPU 1005, and the storage circuit 1006) also operate when the switches 1009 and 1010 are turned to the ON state and the power voltage Vd is supplied to these circuit blocks.

The comparator circuit 1700 has a pair of input terminals I1 and I2. The sensor data from the sensor 2101 (FIG. 1) is input to the input terminal I1 through the holding circuit 1008 (FIG. 1). Then, the Min value (lower limit) and the Max value (upper limit) are input to the input terminal I2 from the non-volatile memory 1007. In the present embodiment, the Min and Max values supplied form the non-volatile memory 1007 are input to the input terminal I2 in time division. In other words, the Min value is input to the input terminal I2, and then the Max value is input to the input terminal I2. When the power supply voltage Vd is supplied through the switch 1009, the comparator circuit 1700 compares the Min value supplied to the input terminal I2 with the value of the sensor data supplied to the input terminal I1. Then, the comparator circuit 1700 supplies the comparison result to the control circuit 1701. Next, the comparator circuit 1700 compares the Max value supplied to the input terminal I2 with the value of the sensor data, and supplies the comparison result to the control circuit 1701. In this case, the sensor data held by the holding circuit 1008 is supplied to the input terminal I1 of the comparator circuit 1700. Thus, the values of the sensor data to be compared with the Min value and the Max value are the same value.

The control circuit 1701 forms the detection signal CC and the common activation signal CS based on the two comparison results supplied from the comparator circuit 1700. Then, the control circuit 1701 supplies the detection signal CC to the RTC 1001, and supplies the common activation signal CS to the control node n2 of the switch 1010. When the control circuit 1701 determines that the value of the sensor data is higher than the Min value and lower than the Max value based on the comparison results of the comparator circuit 1700, in other words, when the control circuit 1701 determines that the value of the sensor data exists within the tolerance range, the comparator circuit 1701 changes the common activation signal CS to the low level and the detection signal CC to the high level. Since the common activation signal CS is changed to the low level, the switch 1010 continues the OFF state. Further, since the detection signal CC is changed to the high level, the RTC 1001 changes each of the activation signal SW1 and the first activation signal SW3 to the low level. Then, as described in step S1404 in FIG. 14, each of the switches 2105 and 1009 changes from the ON state to the OFF state.

On the other hand, when the control circuit 1701 determines that the value of the sensor data is lower than the Min value or higher than the Max value based on the comparison results of the comparator circuit 1700, the control circuit 1701 changes the common activation signal CS to the high level and the detection signal CC to the low level. In response to the lows level detection signal CC, the RTC 1001 continues to keep the activation signal SW1 and the first activation signal SW3 in the high level state. In this way, each of the switches 2105 and 1009 continues the ON state (step S1407 in FIG. 14). Further, since the common activation signal CS is changed to the high level, the switch 1010 is turned to the ON state in step S1407 in FIG. 14.

As described above, whether the sensor data exists within the tolerance range with respect to the previous measurement results is determined by the comparator 1002.

In the present embodiment, when the sensor data does not exist within the predetermined range (tolerance range), in other words, when the sensor data exceeds the tolerance range, the time Te that allows the processing circuit to operate is generated (inserted). When the sensor data exists within the predetermined range, the time that allows the processing circuit to operate is not generated (inserted). In the measurement that periodically performed, it is possible to increase the proportion of the time for preventing the circuit blocks including the processing circuit from operating. As a result, it is possible to suppress the increase in the power consumption.

More specifically, in the present embodiment, when the sensor data (analog signal) from the sensor is periodically obtained by the semiconductor device with a relatively moderate change in the measurement value (for example, as shown in FIG. 19), the measurement value is identified only by the process of comparing the sensor data with the value based on the previous measurement result with the sensor data (with the tolerance taken into account) by the comparator. Thus, it is possible to reduce the frequency of the operation to perform AD conversion or other processing within the semiconductor device. For example, in the power consumption profile according to the present invention shown in FIG. 18, the total consumption energy of the electronic device 10 can be reduced to approximately half or less compared to FIG. 20.

As described above, in the present embodiment, it is possible to reduce the frequency of the operation such as AD conversion operation performed in the semiconductor device. As a result, it is possible to suppress or reduce the consumption energy of the whole electronic device.

<Variation>

In FIG. 1, the sensor data from the sensor 2101 is held by the holding circuit 1008. Then, the sensor data, which is an analog signal and held by the holding circuit 1008, is supplied to the comparator 1002 and the AD conversion circuit 1004. In other words, the holding circuit 1008 is common to the comparator 1002 and the AD conversion circuit 1004. Because of this configuration, the AD conversion circuit 1004 can perform AD conversion on the senor data which is the same as the sensor data compared with the Max value and the Min value in the comparator 1002. In this way, even if the change in the sensor data is early, it is possible to perform AD conversion on the sensor data out of the tolerance range, and store the converted sensor data in the storage circuit 1006 (FIG. 1.

It may also be possible that the holding circuit is not common to the comparator 1002 and the AD conversion circuit 1006. In other words, as shown by the dashed line in FIG. 17, a holding circuit 1702 may be provided in the comparator 1002. In this case, the holding circuit 1008 is deleted.

The holding circuit 1702 holds the sensor data and supplies to the input terminal I1 of the comparator circuit 1700. In this case also, the holding circuit 1702 is supplied with the power supply voltage Vd through the switch 1009. This makes it possible for the comparator circuit 1700 to continue to supply the held sensor data to the input terminal I1 of the comparator circuit 1700 in two comparison operations, in other words, in the operation of comparing the sensor data with the Min value and in the operation of comparing the sensor data with the Max value.

In this variation, the sensor data used for comparison by the comparator 1002 may be different from the sensor data used for AD conversion by the AD conversion circuit 1004. However, the difference between the sensor data used for comparison by the comparator 1002 and the sensor data used for AD conversion is small as long as the temporal change in the value of the sensor data is moderate. Thus, it can be applied without difficulty.

Second Embodiment

Figure 15:
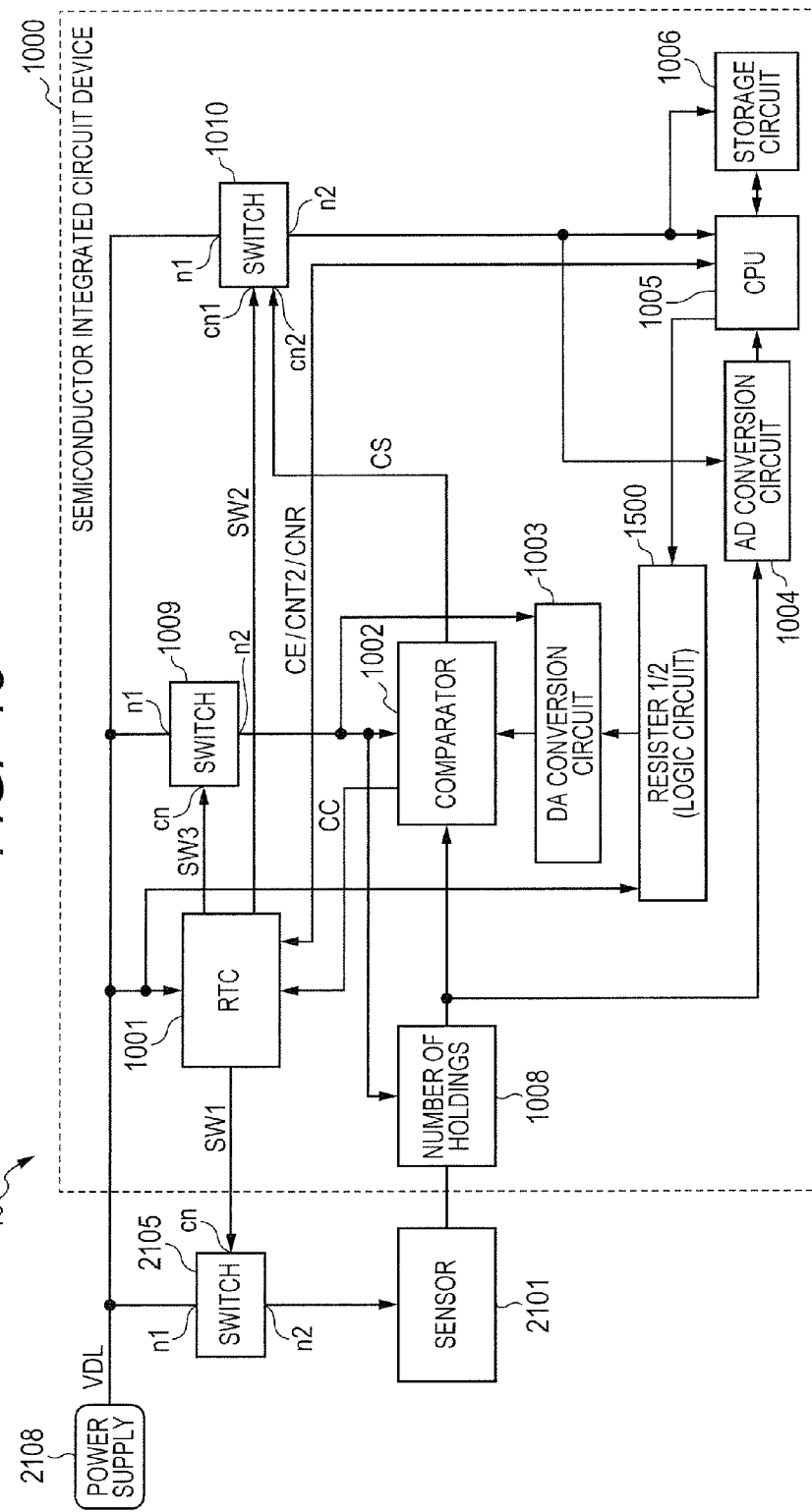
FIG. 15 is a block diagram showing the configuration of an electronic device according to a second embodiment.

FIG. 15 is a block diagram showing the configuration of an electronic device according to a second embodiment. An electronic device 10 shown in FIG. 15 is similar to the electronic device shown in FIG. 1. Here, the description will mainly focus on their difference. Compared to the electronic device shown in FIG. 1, the configuration of the semiconductor device 1000 is changed in the electronic device 10 according to the second embodiment. In other words, a volatile memory 1500 is used in place of the non-volatile memory 1007. Similar to the non-volatile memory 1007, the volatile memory 1500 functions as two registers 1 and 2. Each of the two registers 1 and 2 (marked as register 1/2 in FIG. 15) is configured by a logic circuit. For example, each of the registers 1 and 2 is configured by a plurality of flip-flop circuits. Each flip-flop circuit is configured by a pair of inverter circuits in which the input and output are cross-coupled to each other.

The register 1 in the second embodiment operates in the same manner as the register 1 (1007-1) of the non-volatile memory 1007 shown in FIGS. 1 and 2. Further, the register 2 operates in the same manner as the register 2 (1007-2) of the non-volatile memory 1007. In other words, the lower limit (Min value) is written in the register 1 and the upper limit (Max value) is written in the register 2. The operation of the electronic device 10 is the same as the operation in the first embodiment, and thus the detailed description thereof is omitted. However, each of the registers 1 and 2 is configured by a logic circuit and is a volatile memory. Thus, if the power supply of the power supply voltage Vd is stopped, the stored lower limit or upper limit will disappear. For this reason, in the second embodiment, the power supply voltage Vd is constantly supplied to the volatile memory 1005 (namely, the registers 1 and 2), similar to the case of the RTC 1001. In this way, the registers 1 and 2 constantly operate to be able to prevent disappearance of the lower and upper values.

When a non-volatile memory is formed in the semiconductor device 1000, it is necessary to select the manufacturing process for manufacturing a semiconductor device by taking into account the characteristics of the non-volatile memory, which may lead to cost increase. Since the non-volatile memory is not used in the second embodiment, it is possible to suppress cost increase.

Third Embodiment

In the first and second embodiments, whether the power supply voltage Vd is supplied to each of the circuit blocks is controlled by the switches 2105, 1009, and 1010.

In the third embodiment, each of the sensor 2101, the comparator 1002, the DA conversion circuit 1003, the holding circuit 1008, the registers 1 and 2, the AD conversion circuit 1004, the CPU 1005, and the storage circuit 1006 is configured by a circuit that operates according to an operation clock signal. Further, the power supply voltage Vd and the ground voltage Vs are constantly supplied to the respective circuits.

A clock signal control circuit that can stop supplying the operation clock signal in response to the control signal, is provided in place of each of the switches 2105, 1009, and 1010.

In other words, a first clock signal control circuit is provided, in place of the switch 2105, to stop supplying the operation clock signal to the sensor 2101 in response to the activation signal SW1 from the RTC 1001. Further, a second clock signal control signal is provided, in place of the switch 1009, to stop supplying the operation clock signal to the comparator 1002, the DA conversion circuit 1003, and the registers 1 and 2 in response to the first activation signal SW3 from the RTC 1001. Also, a third clock signal control circuit is provided, in place of the switch 1010, to supply an operation signal to the AD conversion circuit 1004, the CPU 1005, and the storage circuit 1006 in response to the common activation signal CS from the comparator 1002, and to stop supplying the operation clock signal to the AD conversion circuit 1004, the CPU 1005, and the storage circuit 1006 in response to the end signal SW2 from the RTC 1001.

Each of the first to third clock signal control circuits supplies an operation clock signal when each of the corresponding switches 2105, 1009, and 1010 is turned to the ON state in the first and second embodiments. Further, each of the first to third clock signal control circuits stops supplying the operation clock signal when each of the corresponding switches 2105, 1009, and 1010 is turned to the OFF state in the first and second embodiments. With this configuration, in the third embodiment, the supply of the operation clock signal is stopped when the supply of the power supply voltage Vd is stopped in the first and second embodiments. As a result, it is possible to suppress the increase in the power consumption similarly to the first and second embodiments.

In the foregoing, the invention made by the present inventors has been concretely described based on the embodiments. However, it is needless to say that the present invention is not limited to the foregoing embodiments and various modifications and alterations can be made within the scope of the present invention. For example, it is assumed in the description of the first to third embodiments that the RTC 1001 is incorporated into the so-called microcontroller. However, the RTC 1001 may be provided separately from the microcontroller. Further, in the first and second embodiments, the power supply of the power supply voltage Vd is controlled by the switches 2105, 1009, and 1010. However, it is also possible to control the power supply of the ground voltage Vs by a switch.

Further in the foregoing description, one type of power supply voltage has been cited as an example of the power supply voltage Vd. However, a plurality of types of power supply voltage may be controlled by switches. For example, if there is a difference in the voltage values of the operation voltage that each of the comparator 1002, the DA conversion circuit 1009, and the CPU 1005 requires to operated, it may be possible to provide a switch for each operation voltage. In other words, a first switch may be provided between the operation voltage the comparator 2002 requires and the comparator 1002, a second switch may be provided between the operation voltage the DA conversion circuit 1003 requires and the DA conversion circuit 1003, and a third switch may be provided between the operation voltage the CPU 1005 requires and the CPU 1005. In this case, the first and second switches are controlled by the first activation signal SW3, and the third switch is controlled by the end signal SW2 and the common activation signal CS.

Further, the power supply voltage inside the semiconductor device 1000 and the power supply voltage outside the semiconductor device 1000 maybe different from each other. For example, when a voltage conversion circuit is provided within the semiconductor device 1000, it is possible to configure such that the voltage from the voltage conversion circuit is supplied to the switches 1009 and 1010.

What is claimed is:

1. A semiconductor device comprising:
    a timer circuit for generating a piece of time information and a first activation signal which is flowing periodically;
    a determination circuit for determining whether the value of an analog input signal exists within a predetermined range, in response to the first activation signal;
    a first conversion circuit for converting the analog input signal to a digital signal, in response to a second activation signal; and
    a processing circuit for processing the digital signal converted by the first conversion circuit, in response to a third activation signal,
    wherein, when the analog input signal does not exist within the predetermine range, the determination circuit generates the second activation signal and the third activation signal,
    wherein the processing circuit stores a piece of digital information corresponding to the digital signal, as well as the piece of time information from the timer circuit, into a storage circuit.

2. A semiconductor device according to claim 1,
    wherein the determination circuit is supplied with its operation voltage in response to the first activation signal,
    wherein the second activation signal and the third activation signal are used as a common activation signal output from the determination circuit,
    wherein each of the first conversion circuit and the processing circuit is supplied with its operation voltage in response the common activation signal.

3. A semiconductor device according to claim 2,
    wherein the processing circuit supplies a completion signal to the timer circuit in response to the completion of the process of storing the piece of digital information and the piece of time information into the storage circuit,
    wherein the timer circuit stops supplying the operation voltage to each of the first conversion circuit and the processing circuit in response to the completion signal.

4. A semiconductor device according to claim 3,
    wherein the semiconductor device comprises a holding circuit for holding the analog input signal in response to the first activation signal,
    wherein the analog input signal held by the holding circuit is supplied to the determination circuit and the first conversion circuit.

5. A semiconductor device according to claim 4,
    wherein the semiconductor device comprises:
    a first register for storing apiece of first digital information corresponding to the lower limit of the predetermined range;
    a second register for storing a piece of second digital information corresponding to the upper limit of the predetermined range; and
    a second conversion circuit for sequentially converting the piece of first digital information and the piece of second digital information to analog signals, and for supplying the analog signals to the determination circuit.

6. A semiconductor device according to claim 5,
    wherein each of the piece of first digital information and the piece of second digital information is determined based on the piece of digital information stored in the storage circuit and based on a predetermined threshold.

7. A semiconductor device according to claim 6,
    wherein each of the first register and the second register is an electrically rewritable non-volatile memory.

8. A semiconductor device according to claim 1,
    wherein when the determination circuit determines that the analog input signal exists within the predetermined range, each of the first conversion circuit and the processing circuit is put into the non-operating state by the determination circuit.

9. A semiconductor device according to claim 1,
    wherein an operation clock signal is supplied to each of the first conversion circuit and the processing circuit in response to the second activation signal and the third activation signal.

10. An electronic device comprising:
    a semiconductor device according to claim 1; and
    a sensor for supplying the analog input signal to the semiconductor device,
    wherein the sensor supplies the analog input signal to the semiconductor device in response to the first activation signal.

11. A sensing method having a processing circuit and a timer circuit to sense an analog input signal at a predetermined time interval by the timer circuit,
    wherein the periods of the predetermined time interval include:
    a first period for determining whether the value of the analog input signal exists within a predetermined range; and
    a second period when the processing circuit is turned to the non-operating state,
    wherein when it is determined that the value of the analog input signal does not exist within the predetermined range in the first period, a third period is inserted into the period with the second period being shortened, in order that the processing circuit operates to hold the piece of digital information corresponding to the analog input signal into the storage circuit.

12. A sensing method according to claim 11,
    wherein the third period includes the period when the conversion circuit for converting the analog input signal to the piece of digital information is in operation.

* * * * *